United States Patent
Krueger et al.

(10) Patent No.: US 11,150,264 B2
(45) Date of Patent: Oct. 19, 2021

(54) FEEDTHROUGH REJECTION FOR OPTOMECHANICAL DEVICES USING ELEMENTS

(71) Applicant: Honeywell International Inc., Morris Plains, NJ (US)

(72) Inventors: Neil Krueger, Saint Paul, MN (US); Joshua Dorr, Minneapolis, MN (US); Steven Tin, Plymouth, MN (US); Chad Fertig, Bloomington, MN (US); Arthur Savchenko, Kirkland, WA (US)

(73) Assignee: Honeywell International Inc., Charlotte, NC (US)

( * ) Notice: Subject to any disclaimer, the term of this patent is extended or adjusted under 35 U.S.C. 154(b) by 190 days.

(21) Appl. No.: 16/539,984

(22) Filed: Aug. 13, 2019

(65) Prior Publication Data
US 2021/0048448 A1 Feb. 18, 2021

(51) Int. Cl.
*G01P 15/097* (2006.01)
*B81B 3/00* (2006.01)

(52) U.S. Cl.
CPC .......... *G01P 15/097* (2013.01); *B81B 3/0067* (2013.01); *B81B 3/0083* (2013.01); *B81B 2201/0235* (2013.01)

(58) Field of Classification Search
CPC ...... G01P 3/36; G01P 15/097; G01P 15/0802; G01P 15/093; G01H 9/00; G01H 9/004;
(Continued)

(56) References Cited

U.S. PATENT DOCUMENTS

| 3,499,331 A | 3/1970 | Miller |
| 4,233,847 A | 11/1980 | Walker |

(Continued)

FOREIGN PATENT DOCUMENTS

| CN | 107219378 A | 9/2017 |
| CN | 108519498 A | 9/2018 |

(Continued)

OTHER PUBLICATIONS

Beyazoglu, "Integrated MEMS Cavity Optomechanical Oscillators for Wireless and Optical Communications," Electrical Engineering and Computer Sciences University of California at Berkeley, Aug. 12, 2016, 130 pp.

(Continued)

*Primary Examiner* — Benjamin R Schmitt
(74) *Attorney, Agent, or Firm* — Shumaker & Sieffert, P.A.

(57) ABSTRACT

An optomechanical device comprising an assembly, one or more laser devices configured to generate a first optical signal and a second optical signal, and circuitry. The circuitry is configured to modulate the second optical signal and output the first optical signal and the second optical signal to the assembly. A first element of a first beam structure shifts the first spatial frequency of the assembly by approximately 180 degrees and a second element of a second beam structure shifts the second spatial frequency of the assembly by approximately 180 degrees such that a first optical resonance is generated, which is probed by the first optical signal interacting with the assembly, and a second optical resonance is generated, which is probed by the second optical signal interacting with the assembly, where the first optical resonance and the second optical resonance are spectrally separated by a minimum threshold.

20 Claims, 23 Drawing Sheets

(58) Field of Classification Search
CPC .... G01H 13/00; B81B 3/0083; B81B 3/0067; B81B 2201/0235
See application file for complete search history.

(56) References Cited

U.S. PATENT DOCUMENTS

| | | | |
|---|---|---|---|
| 4,345,482 A | 8/1982 | Adolfsson et al. |
| 4,422,331 A | 12/1983 | Walker |
| 4,428,234 A | 1/1984 | Walker |
| 4,628,175 A | 12/1986 | Nissl |
| 4,733,561 A | 3/1988 | Gilby |
| 4,739,660 A | 4/1988 | Fima |
| 4,897,541 A | 1/1990 | Philips |
| 4,900,918 A | 2/1990 | Killian |
| 5,013,909 A | 5/1991 | Sondergeld et al. |
| 5,109,693 A | 5/1992 | Hojo et al. |
| 5,291,014 A | 3/1994 | Brede et al. |
| 5,496,436 A | 3/1996 | Bernstein et al. |
| 5,501,103 A | 3/1996 | Woodruff et al. |
| 5,559,358 A | 9/1996 | Burns et al. |
| 5,689,107 A | 11/1997 | Hsu |
| 5,770,473 A | 6/1998 | Hall et al. |
| 5,786,927 A | 7/1998 | Greywall |
| 6,018,390 A | 1/2000 | Youmans et al. |
| 6,182,509 B1 | 2/2001 | Leung |
| 6,350,983 B1 | 2/2002 | Kaldor et al. |
| 6,481,283 B1 | 11/2002 | Cardarelli |
| 6,510,737 B1 | 1/2003 | Hobbs |
| 6,546,798 B1 | 4/2003 | Waters et al. |
| 6,594,061 B2 | 7/2003 | Huang et al. |
| 6,745,627 B1 | 6/2004 | Woodruff et al. |
| 6,763,723 B1 | 7/2004 | Zook et al. |
| 6,789,053 B2 | 9/2004 | Collins |
| 6,807,325 B1 | 10/2004 | Kraemmer et al. |
| 6,911,765 B2 | 6/2005 | Kawashima |
| 6,947,642 B2 | 9/2005 | Yamazaki |
| 6,955,085 B2 | 10/2005 | Jones et al. |
| 7,243,542 B2 | 7/2007 | Hulsing, II |
| 7,427,522 B2 | 9/2008 | Morikawa et al. |
| 7,573,924 B2 | 8/2009 | Tsuda et al. |
| 7,612,887 B2 | 11/2009 | Choi et al. |
| 7,613,367 B2 | 11/2009 | Levy et al. |
| 7,743,661 B2 | 6/2010 | Berthold et al. |
| 7,808,618 B1 | 10/2010 | Tawney et al. |
| 7,822,090 B2 | 10/2010 | Minamio et al. |
| 7,881,565 B2 | 2/2011 | Kilic et al. |
| 7,920,270 B2 | 4/2011 | Chow et al. |
| 7,980,115 B2 | 7/2011 | Stewart et al. |
| 8,159,736 B2 | 4/2012 | Maleki et al. |
| 8,288,926 B2 | 10/2012 | Furuhata et al. |
| 8,334,984 B2 | 12/2012 | Perez et al. |
| 8,537,368 B2 | 9/2013 | Kilic et al. |
| 8,677,821 B2 | 3/2014 | Ayazi et al. |
| 8,726,732 B2 | 5/2014 | Littler et al. |
| 8,875,578 B2 | 11/2014 | Smith |
| 8,904,867 B2 | 12/2014 | Martin et al. |
| 8,960,002 B2 | 2/2015 | Nasiri et al. |
| 9,069,004 B2 | 6/2015 | Bhave et al. |
| 9,194,782 B2 | 11/2015 | Jeon et al. |
| 9,207,081 B2 | 12/2015 | Geen |
| 9,228,916 B2 | 1/2016 | Valdevit et al. |
| 9,239,340 B2 | 1/2016 | Hutchinson et al. |
| 9,261,525 B2 | 2/2016 | Thiruvenkatanathan et al. |
| 9,335,271 B2 | 5/2016 | Pruessner et al. |
| 9,417,260 B2 | 8/2016 | Bulatowicz |
| 9,455,354 B2 | 9/2016 | Acar |
| 9,618,531 B2 | 4/2017 | Painter et al. |
| 9,753,055 B2 | 9/2017 | Paquet et al. |
| 9,766,099 B2 | 9/2017 | Pechstedt |
| 9,927,458 B2 | 3/2018 | Bramhavar et al. |
| 9,983,225 B2 | 5/2018 | Fertig et al. |
| 10,031,158 B1 | 7/2018 | Douglas et al. |
| 10,079,467 B2 | 9/2018 | Guzman et al. |
| 10,107,936 B2 | 10/2018 | Compton |
| 10,126,321 B2 | 11/2018 | Zandi et al. |
| 10,139,564 B1 | 11/2018 | Homeijer et al. |
| 2004/0129867 A1 | 7/2004 | Mackey |
| 2013/0204573 A1 | 8/2013 | Kandler |
| 2014/0043614 A1 | 2/2014 | Dhayalan et al. |
| 2016/0139170 A1 | 5/2016 | Dwyer et al. |
| 2016/0377647 A1* | 12/2016 | Fertig .................. G01P 15/097 |
| | | | 73/1.38 |
| 2017/0057809 A1 | 3/2017 | Saint-Patrice et al. |
| 2017/0089944 A1 | 3/2017 | Duraffourg |
| 2017/0242050 A1 | 8/2017 | Pan et al. |
| 2018/0003749 A1 | 1/2018 | Dogiamis et al. |
| 2018/0128850 A1 | 5/2018 | Bramhavar et al. |
| 2018/0172723 A1 | 6/2018 | Bramhavar et al. |
| 2018/0246139 A1 | 8/2018 | Zotov et al. |
| 2018/0267078 A1 | 9/2018 | Sato |
| 2019/0049485 A1 | 2/2019 | Stewart et al. |

FOREIGN PATENT DOCUMENTS

| | | |
|---|---|---|
| EP | 1310801 A1 | 5/2003 |
| EP | 3112879 A1 | 1/2017 |
| WO | 0071981 A1 | 11/2000 |
| WO | 2008043737 A2 | 4/2008 |
| WO | 2015080662 A1 | 6/2015 |
| WO | 2018197857 A1 | 11/2018 |

OTHER PUBLICATIONS

Chen et al., "Optical Microfiber Technology for Current, Temperature, Acceleration, Acoustic, Humidity and Ultraviolet Light Sensing," Laser Physics and Photonic Devices Laboratories, School of Engineering, University of Australia, sensors, MDPI, Dec. 28, 2017, 25 pp.

Chiu et al., "Development and Characterization of a CMOS-MEMS Accelerometer With Differential LC-Tank Oscillators," Journal of Microelectromechanical Systems, vol. 22, No. 6, Dec. 2013, pp. 1285-1295.

Cohen et al., "High-Q microphotonic electro-optic modulator," Department of Electrical Engineering, University of Southern California, PERGAMON, Solid-State Electronics, vol. 45, Mar. 29, 2001, 13 pp.

Gerberding et al., "Optomechanical reference accelerometer," Metrologia, vol. 52, No. 5, Apr. 2015, 13 pp.

Grutter, "Optical Whispering-Gallery Mode Resonators for Applications in Optical Communication and Frequency Control," Electrical Engineering and Computer Sciences University of California at Berkeley, Dec. 20, 2013, 127 pp.

Hutchison et al., "Z-Axis Optomechnical Accelerometer," IEEE 25th International Conference on Micro Electro Mechanical Systems (MEMS), Jan. 29 through Feb. 2, 2012, 5 pp.

Kavitha et al., "Study of squeeze film damping characteristics under different gas mediums in a capacitive MEMS accelerometer," The Brazilian Society of Mechanical Sciences and Engineering, Feb. 20, 2015, 12 pp.

Krause et al., "A high-resolution microchip optomechanical accelerometer," Nature Photonics, Oct. 14, 2012, 5 pp.

Krause et al., "Optical read out and feedback cooling of a nanostring optomechanical cavity," Laboratory of Applied Physics, California Institute of Technology, Jun. 3, 2015, 13 pp.

Lee et al., "Fabrication of a Micro-Opto-Mechanical Accelerometer Based on Intensity Modulation", Microsystems Technologies, vol. 10, Issue 2, Jan. 2004, 12 pp.

Li et al., "Characterization and Testing of a Micro-g Whispering Gallery Mode Optomechanical Accelerometer," Journal of Lightwave Technology, vol. 36, Issue 18, May 25, 2018, 8 pp.

Lu et al. "Optical Acceleration Measurement Method with Large Non-ambiguity Range and High Resolution via Synthetic Wavelength and Single Wavelength Superheterodyne Interferometry," MDPI, Sensors, vol. 18, Oct. 12, 2018, 11 pp.

Miao et al., "A microelectromechanically controlled cavity optomechanical sensing system," New Journal of Physics, Apr. 4, 2012, 17 pp.

Oudich et al., "Optomechanic interaction in a corrugated phoxonic nanobeam cavity," Physical Review B, Jun. 2014, 9 pp.

(56) References Cited

OTHER PUBLICATIONS

Pruessner et al., "Integrated waveguide-BDR microcavity optomechanical system," Optical Society of America, Optics Express, vol. 19, No. 22, Oct. 24, 2011, 15 pp.
Schliesser et al., "High-sensitivity monitoring of micromechanical vibration using optical whispering gallery mode resonators," New Journal of Physics, vol. 10, Sep. 30, 2008, 25 pp.
Sheikhaleh et al., "An Optical MEMS Accelerometer Based on a Two-Dimensional Photonic Crystal Add-Drop Filter," IEEE, Journal of Lightwave Technology, vol. 35, No. 14, Jul. 15, 2017, 6 pp.
U.S. Appl. No. 16/371,657, filed Apr. 1, 2019, by Fertig et al.
U.S. Appl. No. 16/371,762, filed Apr. 1, 2019, by Fertig et al.
U.S. Appl. No. 16/391,074, filed Apr. 22, 2019, by Dorr et al.
U.S. Appl. No. 16/391,114, filed Apr. 22, 2019, by Dorr et al.
U.S. Appl. No. 16/514,864, filed Jul. 17, 2019, by Krueger et al.
U.S. Appl. No. 16/514,905, filed Jul. 17, 2019, by Krueger et al.
U.S. Appl. No. 16/539,949, filed Aug. 13, 2019, by Krueger et al.
U.S. Appl. No. 16/539,974, filed Aug. 13, 2019, by Dorr et al.
Williamson et al., "Dual-Carrier Floquet Circulator with Time-Modulated Optical Resonators," Microelectronics Research Center, American Chemical Society, ACS Photonics, vol. 5, Aug. 20, 2018, 9 pp.
Yen et al., "Corrugated aluminum nitride energy harvesters for high energy conversion effectiveness," Journal of Micromechanics and Microengineering, vol. 21, No. 8, Jul. 2011, 3 pp.
Zhang et al., "A Compact Low-Power Oscillation Circuit for the High Performance Silicon Oscillating Accelerometer," AIP Conference Proceedings 1890, 040068, Oct. 5, 2017, 7 pp.
Zhang et al., "Noise suppression of a micro-grating accelerometer based on the dual modulation method," OSA Publishing, Applied Optics, vol. 56, Issue 36, Apr. 2, 2019, 4 pp.
Thompson et al., "Parametrically Amplified Z-Axis Lorentz Force Magnetometer," Journal of Microelectromechanical Systems, vol. 20, No. 3, Jun. 2011, 9 pp.

\* cited by examiner

FEEDTHROUGH REJECTION FOR OPTOMECHANICAL DEVICES USING ELEMENTS

STATEMENT REGARDING FEDERALLY SPONSORED RESEARCH OR DEVELOPMENT

This invention was made with Government support under N66001-16-C-4018 awarded by SPAWAR Systems Center Pacific. The Government has certain rights in the invention. This material is based upon work supported by the Defense Advanced Research Projects Agency (DARPA) and Space and Naval Warfare Systems Center Pacific (SSC Pacific).

TECHNICAL FIELD

This disclosure relates to optomechanical devices, such as accelerometers configured to measure acceleration using an optical signal.

BACKGROUND

Optomechanical devices include devices for detecting acceleration, velocity, vibration, and other parameters. For example, in an optomechanical accelerometer, the resonance frequency of a mechanical structure is shifted under acceleration in the optomechanical device. The mechanical resonance frequency can be read out with an optical field by applying near-resonant light to the structure's optical resonance and measuring the transmitted or reflected optical signal.

SUMMARY

In general, this disclosure is directed to devices, systems, and techniques for reducing drive feedthrough in optomechanical devices. As used herein, drive feedthrough may refer to the portion of the optical driving field which leaks into the detection path and is independent of acceleration. Drive feedthrough may limit the ultimate noise floor and hence performance of the optomechanical device. For example, a circuit may be configured to output the first optical signal as a driving field to drive a mechanical response to an assembly and output the second optical signal as a sensing field to the assembly to detect one or more of a modulation in phase or frequency of mechanical vibrations in the assembly. Moreover, techniques described herein may provide two optical resonances that are spectrally distinct and spatially overlapped for the first and second optical signals, thereby further improving a performance of the optomechanical device.

In one example, an optomechanical device for producing and detecting optical signals includes: an assembly, wherein the assembly comprises a first beam structure comprising a first spatial frequency and a second beam structure comprising a second spatial frequency; one or more laser devices configured to generate a first optical signal and a second optical signal, wherein the first optical signal comprises a frequency different than a frequency of the second optical signal; and circuitry configured to: modulate, with an electro-optic modulator (EOM), the second optical signal; output the first optical signal and the second optical signal to the assembly, wherein a first element of the first beam structure shifts the first spatial frequency of the assembly by approximately 180 degrees and a second element of the second beam structure shifts the second spatial frequency of the assembly by approximately 180 degrees such that a first optical resonance is generated, which is probed by the first optical signal interacting with the assembly, and a second optical resonance is generated, which is probed by the second optical signal interacting with the assembly, and wherein the first optical resonance and the second optical resonance are spectrally separated by a minimum threshold; generate a filtered optical signal corresponding to a response by the assembly to the first optical signal without the second optical signal; and generate an electrical signal based on the filtered optical signal, wherein the EOM modulates the second optical signal based on the electrical signal.

In another example, a method for producing and detecting optical signals, the method comprises: generating, by one or more laser devices, a first optical signal and a second optical signal, wherein the first optical signal comprises a frequency different than a frequency of the second optical signal; modulating, by an EOM of circuitry, the second optical signal; outputting, by the circuitry, the first optical signal and the second optical signal to an assembly, wherein the assembly comprises a first beam structure comprising a first spatial frequency and a second beam structure comprising a second spatial frequency, wherein a first element of the first beam structure shifts the first spatial frequency of the assembly by approximately 180 degrees and a second element of the second beam structure shifts the second spatial frequency of the assembly by approximately 180 degrees such that a first optical resonance is generated, which is probed by the first optical signal interacting with the assembly, and a second optical resonance is generated, which is probed by the second optical signal interacting with the assembly, and wherein the first optical resonance and the second optical resonance are spectrally separated by a minimum threshold; generating, by the circuitry, a filtered optical signal corresponding to a response by the assembly to the first optical signal without the second optical signal; and generating, by the circuitry, an electrical signal based on the filtered optical signal, wherein the EOM is configured to modulate the second optical signal based on the electrical signal.

In another example, an optomechanical device for producing and detecting optical signals includes: an assembly comprising a first beam structure and a second beam structure, the first beam structure comprising a first plurality of indentations that are each spaced apart from an adjacent indentation of the first plurality of indentations by a first spacing and the second beam structure comprising a second plurality of indentations that are each spaced apart from an adjacent indentation of the second plurality of indentations by a second spacing; one or more laser devices configured to generate a first optical signal and a second optical signal, wherein the first optical signal comprises a frequency different than a frequency of the second optical signal; and circuitry configured to: modulate, with an EOM, the second optical signal; output the first optical signal and the second optical signal to the assembly, wherein a first perturbed indentation of the first beam structure shifts a first spatial frequency of the first beam structure and a second perturbed indentation of the second beam structure shifts a second spatial frequency of the second beam structure such that a first optical resonance is generated, which is probed by the first optical signal interacting with the assembly, and a second optical resonance is generated, which is probed by the second optical signal interacting with the assembly, and wherein the first optical resonance and the second optical resonance are spectrally separated by a minimum threshold; generate a filtered optical signal corresponding to a response by the assembly to the first optical signal without the second optical signal; and generate an electrical signal based on the filtered optical signal, wherein the EOM modulates the second optical signal based on the electrical signal.

The summary is intended to provide an overview of the subject matter described in this disclosure. It is not intended to provide an exclusive or exhaustive explanation of the systems, device, and methods described in detail within the accompanying drawings and description below. Further details of one or more examples of this disclosure are set forth in the accompanying drawings and in the description below. Other features, objects, and advantages will be apparent from the description and drawings, and from the claims.

BRIEF DESCRIPTION OF DRAWINGS

Like reference characters denote like elements throughout the description and figures.

DETAILED DESCRIPTION

Figure 1:
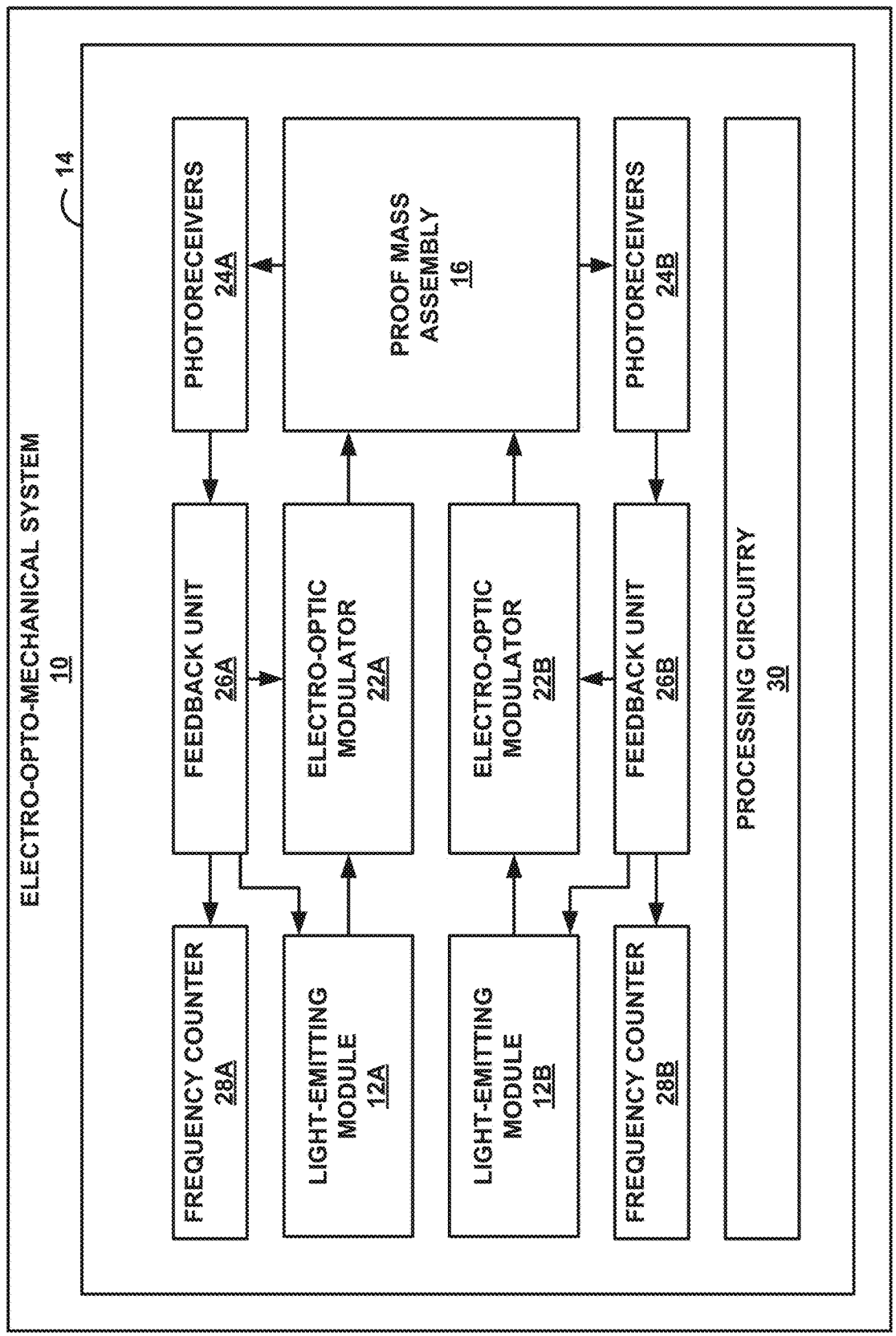
FIG. 1 is a block diagram illustrating an electro-opto-mechanical system, in accordance with one or more techniques of this disclosure.

This disclosure describes devices, systems, and techniques for reducing drive feedthrough into the detection for optomechanical devices, such as, for example, but not limited to, optomechanical accelerometers, electrical filters (e.g., high pass filters, low pass filters, and band pass filters), strain sensors, pressure sensors, force sensors, and gyroscopes, where the structures have a coupled optical degree of freedom, and could help improve performance of such optomechanical devices. For example, in an optomechanical accelerometer, a resonance frequency of a mechanical structure is shifted under acceleration in the optomechanical device. The mechanical resonance frequency can be measured with an optical field by applying near-resonant light to the structure's optical resonance and measuring the transmitted or reflected light (as the mechanical resonance frequency is imprinted as modulation of the phase and/or amplitude of the light by virtue of optical-mechanical coupling in the device). To increase the signal to noise of the mechanical frequency measurement, systems may drive the mechanical resonance to a larger amplitude by strongly amplitude modulating the light field at or near the mechanical resonance frequency, which may be referred to as a "driving modulation" of the input optical field. In contrast, the "sense modulation" may refer to a modulation induced on the outgoing optical field by the mechanical vibrations and can be less than, or even much less than, the driving modulation of the incoming driving optical field. In optomechanical devices in which a single laser field is used to both drive and sense, the outgoing sense optical field thus can have a deleterious "feed-through" modulation present on the optical field, which can fundamentally distort, obscure, or otherwise decreases the quality of the optical signal.

Techniques described herein may help to eliminate feedthrough modulation in optomechanical sensors. Some systems may use a dual-laser drive/sense scheme in which the drive laser and sense laser that interact with the optomechanical sensor are spectrally-disparate and placed at non-overlapping positions relative to the optical resonance of the optomechanical sensor (e.g., see FIGS. 7, 8, etc.). As a result, a wavelength-selective optical component (e.g. dichroic filter) can be used to isolate the sense signal, eliminating distortions induced by the "feed-through" associated with the drive laser's modulation and providing a cleaner, higher-quality sense signal (e.g., see FIGS. 9-11) by deploying the approach via system 610 illustrated in FIG. 6.

In some applications, a less than 1 nanometer (nm) wavelength transition in the transmission spectrum of the dichroic filter may be used such that that sense signal is entirely passed/redirected and the drive/"feed-through" is entirely redirected/passed. However, some dichroic filters may exhibit transitions in their transmission spectrum that span many nm of optical wavelength, making it difficult to fully separate the sense and "feed-through" signals. While some Dichroic filters with sharper transitions may be used, such dichroic filters may have added design and manufacturing complexity compared to dichroic filters that exhibit transitions in their transmission spectrum that span many (e.g., more than 10, more than 50, etc.) nm of optical wavelength. An alternative to sharp dichroic filters would be the ability to create a greater spectral separation between the sense laser and drive laser (and resulting "feed-through").

This disclosure describes improvements that may help to reduce drive feedthrough into the detection for optomechanical device, and may help such an optomechanical device achieve increased ultimate performance. For example, a larger spectral separation between sense laser and drive laser can be accomplished by utilizing an optomechanical sensor that features not one optical resonance, but two optical resonances that are designed to be spectrally and spatially overlapped. Under these conditions, the resonance degeneracy results in split resonances that still share the same spatial proximity (which may be beneficial/critical to ensure common-mode behavior and equivalent optomechanical coupling), but are now spectrally-distinct (See FIG. 20).

For example, the optomechanical device may include an electro-opto-mechanical system configured to precisely measure very high acceleration values (e.g., up to 500,000 meters per second squared (m/s$^2$)). The electro-opto-mechanical system may use a combination of electrical signals, optical signals, and mechanical signals to determine the acceleration of the object.

An optomechanical device may be configured to measure the acceleration, velocity, vibration, etc. of the object in real-time or near real-time, such that processing circuitry may analyze the acceleration, velocity, vibration, etc. of the object over a period of time to determine a positional displacement of the object during the period of time. For example, the optomechanical device may be a part of an Inertial Navigation System (INS) for tracking a position of an object based, at least in part, on an acceleration of the object. Additionally, the optomechanical device may be located on or within the object such that the optomechanical device accelerates, moves, vibrates, etc. with the object. As such, when the object accelerates, moves, vibrates, etc., the optomechanical device (including the assembly, proof mass assembly, etc.) accelerates, moves, vibrates, etc. with the object. In some examples, because acceleration over time is a derivative of velocity over time, and velocity over time is a derivative of position over time, processing circuitry may, in some cases, be configured to determine the position displacement of the object by performing a double integral of the acceleration of the object over the period of time. Determining a position of an object using the accelerometer system located on the object—and not using on a navigation system separate from the object (e.g., a Global Positioning System (GPS))—may be referred to as "dead reckoning."

The optomechanical device may be configured to achieve high levels of sensitivity in order to improve the accuracy of the acceleration, velocity, vibration, etc. values. High sensitivity may enable the optomechanical device to detect very small acceleration, velocity, vibration, etc. values, detect a very small change in acceleration, velocity, vibration, etc. values, detect a large range of acceleration, velocity, vibration, etc. values, or any combination thereof. Additionally, an optomechanical device may be configured to accurately determine the acceleration, velocity, vibration, etc. of the object while the object is experiencing high levels of acceleration, velocity, vibration, etc. In this way, the an optomechanical device may be configured to enable an INS to accurately track the position of the object while a magnitude of the acceleration, velocity, vibration, etc. of the object is very high.

The optomechanical device may, in some examples, include a MEMS accelerometer which includes a light-emitting device, a circuit, and a proof mass assembly which includes a proof mass suspended within a frame by double-ended tuning fork (DETF) structures. In some examples, the optomechanical device may include a single-ended tuning fork or another assembly. For instance, the optomechanical device may use an assembly suitable for electrical filters (e.g., high pass filters, low pass filters, and band pass filters), strain sensors, pressure sensors, force sensors, gyroscopes, or another assembly.

In some examples, the DETF structures may be configured to guide optical signals. Additionally, optical signals may induce mechanical vibration in the DETF structures. In some cases, acceleration causes a displacement of the proof mass relative to the frame, the displacement affecting mechanical vibration frequencies (e.g., mechanical resonance frequencies) corresponding to the DETF structures. In this way, a mathematical relationship may exist between acceleration and the mechanical vibration frequencies of the DETF structures. As such, the mathematical relationship may be leveraged to determine acceleration. The accelerometer device uses, in some examples, a combination of optical signals and electrical signals to measure the mechanical vibration frequencies corresponding to the DETF structures and calculate acceleration based on the mechanical vibration frequencies.

While examples of an optomechanical device are described with respect to an example accelerometer, techniques described herein for noise rejection may be applied to optomechanical device configured to measure various parameters, including, but not limited to, acceleration, velocity, vibration, and other parameters. Moreover, while examples of the optomechanical device are described with respect to an example proof mass assembly that includes a DETF structure, other structures may be used, for example, but not limited to, a single-ended tuning fork structure or another assembly.

FIG. 1 is a block diagram illustrating an electro-opto-mechanical system 10, in accordance with one or more techniques of this disclosure. FIG. 1 is merely one non-limiting example system architecture that may utilize the techniques of this disclosure for resonator stabilization. As illustrated in FIG. 1, system 10 includes light-emitting devices 12A, 12B (collectively, "light-emitting devices 12"), circuit 14, and proof mass assembly 16. Additionally, in the example illustrated in FIG. 1, circuit 14 includes electro-optic-modulators (EOM) 22A, 22B (collectively, "EOMs 22"), photoreceivers 24A, 24B (collectively, "photoreceivers 24"), feedback units 26A, 26B (collectively, "feedback units 26"), frequency counters 28A, 28B (collectively, "frequency counters 28"), and processing circuitry 30. While the example of FIG. 1 includes two EOMs, two photoreceivers, and two frequency counters, in some examples, an electro-opto-mechanical system may include only one EOM, one photoreceiver, and one frequency counter or more than two EOMs, two photoreceivers, and two frequency counters.

In the example of FIG. 1, light-emitting device 12A, proof mass assembly 16, EOM 22A, photoreceiver 24A, feedback unit 26A, and frequency counter 28A form a first positive feedback loop. Additionally, in the example of FIG. 1, light-emitting device 12B, proof mass assembly 16, EOM 22B, photoreceiver 24B, feedback unit 26B, and frequency counter 28B form a second positive feedback loop. In some examples, the second positive feedback loop may be omitted.

System 10 may be configured to determine an acceleration associated with an object (not illustrated in FIG. 1) based on a measured vibration frequency of a tuning fork structure of proof mass assembly. For example, system 10 may be configured to determine an acceleration associated with an object (not illustrated in FIG. 1) based on a measured vibration frequency of a set of double-ended tuning fork (DETF) structures which suspend a proof mass of proof mass assembly 16, where the vibration of the DETF structures is induced by an optical signal emitted by light-emitting device 12. In some examples, the first positive feedback loop generates a first frequency value representing a vibration frequency of a first DETF structure and the second positive feedback loop generates a second frequency value representing a vibration frequency of a second DETF structure. Based on the first vibration frequency and the second vibration frequency, system 10 may determine a first acceleration value and a second acceleration value, respectively. In some examples, system 10 determines an acceleration of an object based on the first acceleration value and the second acceleration value. In some examples, system 10 determines the acceleration of the object based on only the first acceleration value (e.g., the second positive feedback loop is omitted). In some examples, system 10 determines the acceleration of the object based on only the second acceleration value (e.g., the first positive feedback loop is omitted).

Light-emitting devices 12 may each include a laser device, also referred to herein as simply "laser," configured to emit photons that form an optical signal. In some examples, light-emitting devices 12 emit the photons at an optical power within a range between 0.1 microwatts (µW) and 100 µW. In some examples, light-emitting devices 12 each include a semiconductor laser which includes a laser diode. In some examples, each of light-emitting devices 12 may be configured to generate a first optical signal that interacts with proof mass assembly 16 and, in response to interacting with the proof mass assembly 16, is impressed with one or more of a modulation in phase or frequency of mechanical vibrations in proof mass assembly 16 and a second optical signal that stimulates mechanical vibrations in proof mass assembly 16. In this way, the second optical signal (e.g., a driving optical signal) may provide driving modulation at proof mass assembly and feedback unit 26A may use the first optical signal (e.g., a sense optical signal) that interacts with proof mass assembly 16 while the first optical signal drives the mechanical vibration frequency at proof mass assembly 16.

In some examples, circuit 14 may include a set of electrical components for processing and analyzing electrical signals received by photoreceivers 24. Components of circuit 14 are described in further detail below.

EOMs 22 may represent optical devices configured to modulate, based on electrical signals produced and processed by circuit 14, an optical signal emitted by light-emitting device 12. EOM 22A, for example, may include a set of crystals (e.g., Lithium Niobate crystals), where a refractive index of the set of crystals changes as a function of an electric field proximate to the set of crystals. The refractive index of the crystals may determine a manner in which EOM 22A modulates the optical signal. For example, the crystals of EOM 22A may receive the optical signal from light-emitting device 12 while EOM 22A is also receiving an electrical signal from feedback unit 26A of circuit 14. As such, the electrical signal may affect the electric field proximate to the crystals of EOM 22A, thus causing EOM 22A to modulate the optical signal. In some examples, EOM 22A modulates the optical signal for driving a mechanical response in proof mass assembly 16 by modulating the refractive index of the crystals using the electrical signal. EOM 22A, in some cases, may transmit the modulated optical signal to proof mass assembly 16. In some examples, EOM 22B is substantially similar to EOM 22A, with EOM 22B controlled by an electrical signal from feedback unit 26B.

Photoreceivers 24 (also referred to herein as "photodiodes") may each include one or more transistors configured to absorb photons of an optical signal and output, in response to absorbing the photons, an electrical signal. In this manner, photoreceivers 24 may be configured to convert optical signals into electrical signals. Photoreceivers 24A, for example, may include a p-n junction that converts the photons of the optical signal into the electrical signal, where the electrical signal preserves at least some parameters of the optical signal. One or more frequency values and intensity values associated with the optical signal may be reflected in the electrical signal produced by photoreceivers 24A in response to photoreceivers 24A receiving the optical signal. For example, photoreceivers 24A may produce a stronger electrical signal (e.g., greater current magnitude) in response to receiving a stronger (e.g., greater power) optical signal. Additionally, in some cases, photoreceivers 24A may produce the electrical signal to reflect the one or more frequency values corresponding to the received optical signal. In other words, processing circuitry (e.g., processing circuitry 30) may analyze the electrical signal to determine the one or more frequency values corresponding to the optical signal. Photoreceivers 24A may include semiconductor materials such as any combination of Indium Gallium Arsenide, Silicon, Silicon Carbide, Silicon Nitride, Gallium Nitride, Germanium, or Lead Sulphide. In some examples, photoreceivers 24B is substantially similar to photoreceivers 24A.

Feedback units 26 may each include a set of circuit components for processing electrical signals. In some examples, the set of circuit components included in feedback unit 26A may include any combination of a band pass filter, a phase shifter, an electronic amplifier, and a voltage limiter. Such components may process, or filter, the electrical signal such that certain aspects of the electrical signal may be more efficiently measured (e.g., frequency values or intensity values). In the example of FIG. 1, feedback unit 26A may receive an electrical signal from photoreceiver 24A and output a processed electrical signal to EOM 22A, frequency counter 28A, and light-emitting device 12A. In this way, feedback unit 26A acts as a part of a first positive feedback loop by processing an electrical signal which EOM 22A uses to modulate an optical signal emitted by light-emitting device 12A, where the modulated optical signal passes through proof mass assembly 16 before arriving back at circuit 14 for processing by feedback unit 26A.

Feedback unit 26B may be substantially similar to feedback unit 26A in that feedback unit 26B receives an electrical signal from photoreceiver 24B and delivers a processed electrical signal to frequency counter 28B, EOM 22B, and light-emitting device 12B. As such, feedback unit 26B operates within a second feedback loop in a similar manner to which feedback unit 26A operates within the first feedback loop. Again, feedback unit 26B may be omitted.

Frequency counters 28 are circuit components that are each configured for measuring a frequency of an electrical signal. For example, frequency counter 28A may determine one or more frequency values corresponding to the processed electrical signal produced by feedback unit 26A. Frequency counter 28A may measure frequency values corresponding to the processed electrical signal in real-time or near real-time, such that frequency counter 28A tracks the frequency values as a function of time. Frequency counter 28B may be substantially similar to frequency counter 28A, except frequency counter 28B receives an electrical signal from feedback unit 26B rather than from feedback unit 26A.

Processing circuitry 30, and circuit 14 generally, may include one or more processors that are configured to implement functionality and/or process instructions for execution within system 10. For example, processing circuitry 30 may be capable of processing instructions stored in a storage device (not illustrated in FIG. 1). Processing circuitry 30 may include, for example, microprocessors, digital signal processors (DSPs), application specific integrated circuits (ASICs), field-programmable gate arrays (FPGAs), or equivalent discrete or integrated logic circuitry, or a combination of any of the foregoing devices or circuitry. Accordingly, processing circuitry 30 may include any suitable structure, whether in hardware, software, firmware, or any combination thereof, to perform the functions ascribed herein to processing circuitry 30. Processing circuitry 30, and circuit 14 may include only analog circuitry, only digital circuitry, or a combination of analog circuitry and digital circuitry. The term "processor" or "processing circuitry" may generally refer to any of the foregoing analog circuitry and/or digital circuitry, alone or in combination with other logic circuitry, or any other equivalent circuitry.

Proof mass assembly 16 may include a proof mass, a frame, a set of tethers, and a set of DETF structures. The proof mass, in some examples, is suspended within the frame by the set of tethers and the set of DETF structures. For example, proof mass assembly 16 may include a set of DETF structures that suspend the proof mass in a first direction relative to the frame. Additionally, the set of tethers may suspend the proof mass in a second direction and a third direction relative to the frame. The first direction, the second direction, and the third direction may represent three axes (e.g., x-axis, y-axis, and z-axis) of a Cartesian space. In some cases, the set of DETF structures enable the proof mass to be displaced in the first direction. Additionally, in some cases, the set of tethers prevent the proof mass from being displaced in the second direction and the third direction. In this way, proof mass assembly 16 may only allow the proof mass to be displaced along a single axis (e.g., a displacement axis). Because the displacement of the proof mass may determine the acceleration measured by circuit 14, system 10 may be configured to determine the acceleration relative to the displacement axis.

Proof mass assembly 16 may include a first beam structure and a second beam structure with elements configured for two optical resonances. For example, proof mass assembly 16 may include a first element and second element help to spread out two optical resonances such that a sensing optical signal and a driving optical signal may be easily filtered (e.g., using a Dichroic).

In some examples, the first positive feedback loop (e.g., light-emitting device 12A, proof mass assembly 16, EOM 22A, photoreceiver 24A, feedback unit 26A, and frequency counter 28A) and the second positive feedback loop (e.g., light-emitting device 12B, proof mass assembly 16, EOM 22B, photoreceiver 24B, feedback unit 26B, and frequency counter 28B) are configured to independently determine an acceleration value representative of an acceleration of an object including system 10. For example, light-emitting device 12 may emit an optical signal, EOM 22A may modulate the optical signal for driving a mechanical response in proof mass assembly 16 to obtain a first modulated optical signal, and EOM 22A may transmit the first modulated optical signal to proof mass assembly 16. Photoreceiver 24A may receive the first modulated optical signal from proof mass assembly 16, where properties of the first modulated optical signal received by photoreceiver 24A may be affected by mechanical vibrations of a first DETF structure of proof mass assembly 16. Photoreceiver 24A converts the first modulated optical signal into a first electrical signal and transmits the first electrical signal to feedback unit 26A.

Feedback unit 26A may process the first electrical signal to obtain a first processed electrical signal. For example, feedback unit 26A may use any combination of a first band pass filter, a first phase shifter, a first electronic amplifier, and a first voltage limiter to process the first electrical signal. Frequency counter 28A may receive the first processed electrical signal and determine a first frequency value corresponding to the first processed electrical signal. In some cases, the first frequency value represents a mechanical vibration frequency of the first DETF structure of proof mass assembly 16, which carries the first modulated optical signal ultimately received by photoreceiver 24A.

In addition to transmitting the first processed electrical signal to frequency counter 28A, feedback unit 26A may transmit the first processed electrical signal to EOM 22A. In turn, EOM 22A may modulate the optical signal emitted by light-emitting device 12 based on the first processed electrical signal, where the first modulated optical signal is transmitted to photoreceiver 24A via the first DETF structure of proof mass assembly 16, thus completing the first positive feedback loop. As such, a future mechanical vibration frequency of the first DETF structure depends, at least in part, on a current mechanical vibration frequency of the first DETF structure.

Additionally, in some examples, the second positive feedback loop may determine a second frequency value. For example, light-emitting device 12 may emit an optical signal, EOM 22B may modulate the optical signal to obtain a second modulated optical signal, and EOM 22B may transmit the second modulated optical signal to proof mass assembly 16. Photoreceiver 24B may receive the second modulated optical signal from proof mass assembly 16, where properties of the second modulated optical signal received by photoreceiver 24B may be affected by mechanical vibrations of a second DETF structure of proof mass assembly 16. Photoreceiver 24B converts the second modulated optical signal into a second electrical signal and transmits the second electrical signal to feedback unit 26B.

In some examples, feedback unit 26B processes the second electrical signal to obtain a second processed electrical signal. For example, feedback unit 26B may use any combination of a second band pass filter, a second phase shifter, a second electronic amplifier, and a second voltage limiter to process the second electrical signal. Frequency counter 28B may receive the second processed electrical signal and determine a second frequency value corresponding to the second processed electrical signal. In some cases, the second frequency value represents a mechanical vibration frequency of the second DETF structure of proof mass assembly 16, which carries the second modulated optical signal ultimately received by photoreceiver 24B.

In addition to transmitting the second processed electrical signal to frequency counter 28B, feedback unit 26B may transmit the second processed electrical signal to EOM 22B. In turn, EOM 22B may modulate the optical signal for driving a mechanical response in proof mass assembly 16 and emitted by light-emitting device 12 based on the second processed electrical signal, where the second modulated optical signal is transmitted to photoreceiver 24B via the second DETF structure of proof mass assembly 16, thus completing the second positive feedback loop. As such, a future mechanical vibration frequency of the second DETF structure depends, at least in part, on a current mechanical vibration frequency of the second DETF structure.

Processing circuitry 30 may be configured to calculate, based on the first frequency value, a first acceleration value. In some examples, to calculate the first acceleration value, processing circuitry 30 may subtract a baseline frequency value from the first frequency value to obtain a first frequency difference value. The baseline frequency value may represent a resonant mechanical frequency of the first DETF structure of proof mass assembly 16 while the proof mass is not displaced from a resting point along the proof mass displacement axis. In other words, the modulated optical signal emitted by EOM 22A may induce or drive the first DETF structure to vibrate at the baseline frequency value while the proof mass is not displaced from the resting point along the proof mass displacement axis. As such, when the object is not accelerating, the first frequency difference value may be equal to zero since the first acceleration value—which represents the mechanical frequency of the first DETF structure—is equal to the baseline frequency value when the proof mass is not displaced (e.g., the object carrying system 10 is not accelerating). The first frequency difference value, in some examples, may be correlated with an acceleration of the object. In other words, an increase of a magnitude of the first frequency difference value may indicate an increase in the acceleration of the object and a decrease of a magnitude of the first frequency difference value may indicate decrease in the acceleration of the object.

Additionally, processing circuitry 30 may be configured to calculate a second acceleration value based on the second acceleration value. In some examples, to calculate the second acceleration value, processing circuitry 30 may subtract a baseline frequency value from the second frequency value to obtain a second frequency difference value. The second frequency difference value, in some examples, may be correlated with an acceleration of the object. In other words, an increase of a magnitude of the second frequency difference value may indicate an increase in the acceleration of the object and a decrease of a magnitude of the second frequency difference value may indicate decrease in the acceleration of the object. The first acceleration value and the second acceleration value, which are calculated by processing circuitry 30, may, in some cases, be approximately equal.

Figure 2:
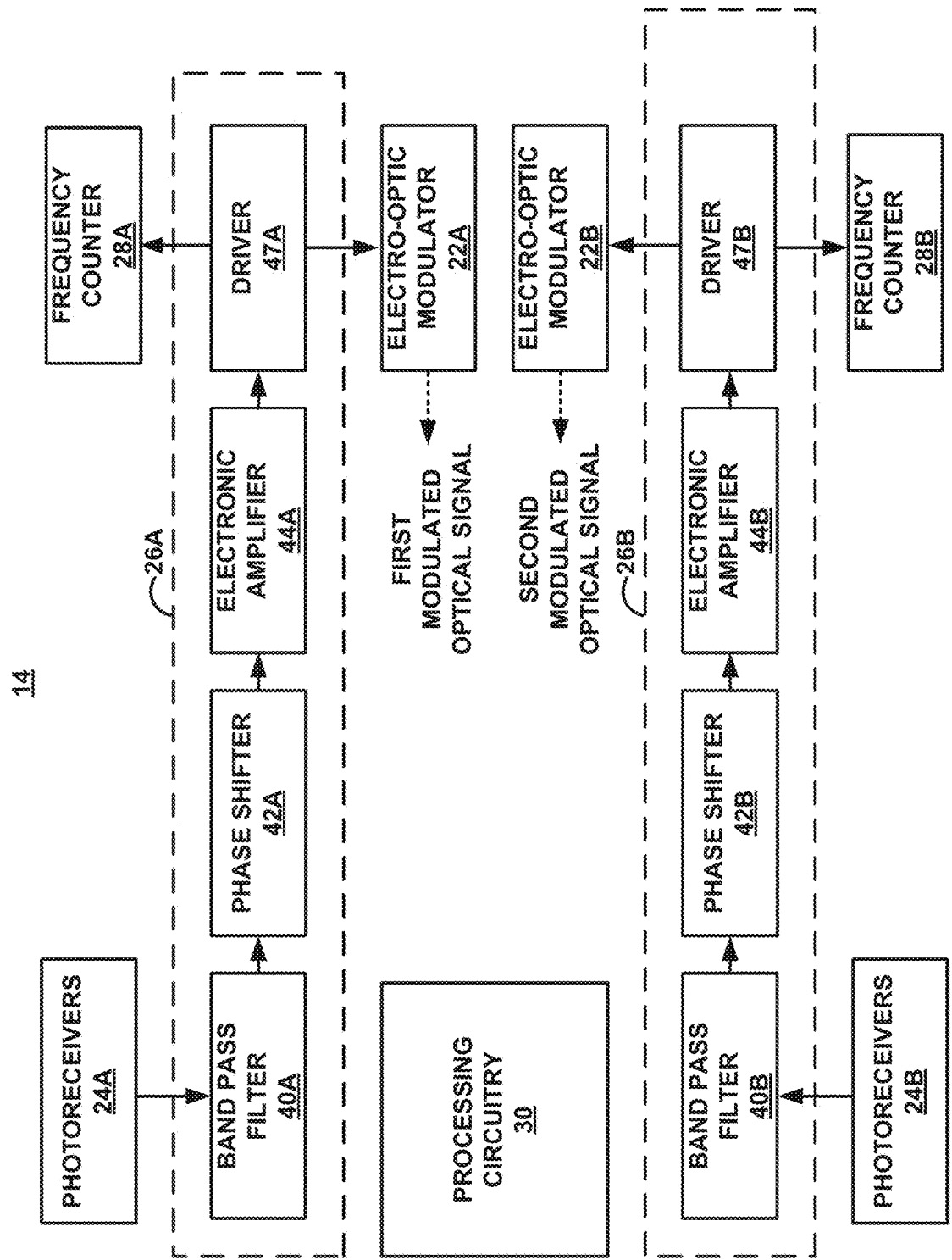
FIG. 2 is a block diagram illustrating the circuit of FIG. 1 in further detail, in accordance with one or more techniques of this disclosure.

FIG. 2 is a block diagram illustrating circuit 14 of FIG. 1 in further detail, in accordance with one or more techniques of this disclosure. As illustrated in FIG. 1, circuit 14 includes EOMs 22, photoreceivers 24, feedback units 26, frequency counters 28, and processing circuitry 30. Feedback units 26 may each include band pass filters 40A, 40B (collectively, "band pass filters 40"), phase shifters 42A, 42B (collectively, "phase shifters 42"), electronic amplifiers 44A, 44B (collectively, "electronic amplifiers 44), and drivers 47A, 47B (collectively, "drivers 47). The first feedback loop includes band pass filter 40A, phase shifter 42A, electronic amplifier 44A, and driver 47A). The second feedback loop includes band pass filter 40B, phase shifter 42B, electronic amplifier 44B, and driver 47B.

Circuit 14 may be configured to receive optical signals from proof mass assembly 16, convert the optical signals into electrical signals, process the electrical signals, analyze the processed electrical signals to determine acceleration values, and use the processed electrical signals to modulate optical signals and reject noise, thus completing the first feedback loop and the second feedback loop. While this example is an accelerometer, in some examples, circuit 14 may be configured to analyze the processed electrical signals to determine other values, such as, for example, but not limited to, velocity, vibration, rotation, and other values. For example, photoreceivers 24A may receive a first modulated optical signal from a first DETF structure of proof mass assembly 16. The first modulated optical signal may include a frequency component associated with the first DETF structure itself, such as a vibration frequency of the first DETF structure. Photoreceivers 24A may convert the first modulated optical signal into a first set of electrical signals, preserving the frequency component indicative of the vibration frequency of the first DETF structure for driver 47A. Photoreceivers 24A may transmit the first set of electrical signals to feedback unit 26A, which includes band pass filter 40A, phase shifter 42A, electronic amplifier 44A, and driver 47A.

Band pass filter 40A may be an electronic filter that attenuates frequencies outside of a frequency range and "passes" frequencies within the frequency range. In some examples, band pass filter 40A includes any combination of passive filters, active filters, infinite impulse response (IIR) filters, finite impulse response (FIR) filters, Butterworth filters, Chebyshev filters, elliptic filters, Bessel filters, Gaussian filters, Legendre filters, or Linkwitz-Riley filters. In some examples, band pass filter 40A includes a combination of a high pass filter which passes frequencies above a high pass cutoff point and a low pass filter which passes frequencies below a low pass cutoff point. In some cases, band pass filter 40A passes frequencies within a range between 100 kilohertz (kHz) and 10,000 kHz.

Phase shifter 42A may be configured to shift a phase of the first electrical signal and the second electrical signal. Phase may be characterized as a position of an instant on a waveform cycle of a periodic waveform. For example, the first electrical signal may include periodic waveforms which represent frequency components of the first electrical signal. A maximum peak of a sine wave for example, may be at a different phase than a minimum peak, or a zero crossing of the sine wave. In some examples, phase shifter 42A may "delay" the first electrical signal by a time value in order to shift a timeline in which frequency components of the first electrical signal oscillate and delay the second electrical signal by a time value in order to shift a timeline in which frequency components of the second electrical signal oscillate.

Electronic amplifier 44A may amplify the first electrical signal and/or the second electrical signal such that an amplitude of the first electrical signal is increased by a gain factor. In other words, electronic amplifier 44A may increase a power of the first electrical signal and second electrical signal. By amplifying the first electrical signal and second electrical signal using electronic amplifier 44A, circuit 14 may improve an ability of processing circuitry 30 to analyze the first electrical signal and the second electrical signal, and modulate the optical signal emitted by light-emitting device 12 using EOM 22A.

Electronic amplifier 44A may include, in some cases, power amplifiers, operational amplifiers, or transistor amplifiers, or any combination thereof. Additionally, in some examples, electronic amplifier 44A is configured to limit a voltage of the first electrical signal and/or second electrical signal to a maximum voltage value. In other words, electronic amplifier 44A may prevent the first electrical signal and the second electrical signal from exceeding the maximum voltage value, meaning that the first processed electrical signal and the second processed electrical signal produced by feedback unit 26A may not exceed the maximum voltage value.

In some examples, the first set of electrical signals may pass through feedback unit 26A in an order from band pass filter 40A, to phase shifter 42A, to electronic amplifier 44A, and to driver 47A, as illustrated in FIG. 2. However, the order illustrated in FIG. 2 is not limiting. Band pass filter 40A, phase shifter 42A, and electronic amplifier 44A may be arranged to process the first electrical signal and second first electrical signal in any order.

Driver 47A may be configured to cause EOM 22A to modulate the optical signal to drive a mechanical resonance of proof mass assembly 16. For example, driver 47A may be configured to generate a mechanical resonance feedback signal that causes EOM 22A to operate near or at the mechanical resonance of proof mass assembly 16. For example, driver 47A may generate the mechanical resonance feedback signal using a signal generator set to the mechanical resonance of proof mass assembly 16. For example, driver 47A may be designed to use a first optical signal (e.g., a sensing optical signal) for sensing a mechanical resonance at proof mass assembly 16 while system 10 may use a second optical signal (e.g., a driving optical signal) for driving the mechanical resonance at proof mass assembly 16.

Driver 47A may transmit a mechanical resonance feedback signal to frequency counter 28A. Frequency counter 28A may determine a first frequency value, and processing circuitry 30 may determine a first acceleration value based on the first frequency value. Additionally, driver 47A may transmit the mechanical resonance feedback signal to EOM 22A and EOM 22A may modulate the optical signal for driving a mechanical response and emitted by light-emitting device 12A based on the mechanical resonance feedback signal generated based on a sensing optical signal. In this way, proof mass assembly 16, photoreceiver 24A, band pass filter 40A, phase shifter 42A, electronic amplifier 44A, driver 47A, EOM 22A, and frequency counter 28A are a part of the first positive feedback loop which produces the first acceleration value associated with the object including system 10.

The components of feedback unit 26B (e.g., band pass filter 40B, phase shifter 42B, electronic amplifier 44B, and driver 47B) may be substantially similar to the respective components of feedback unit 26A. As such, the second positive feedback loop may be substantially similar to the first positive feedback loop.

Figure 3:
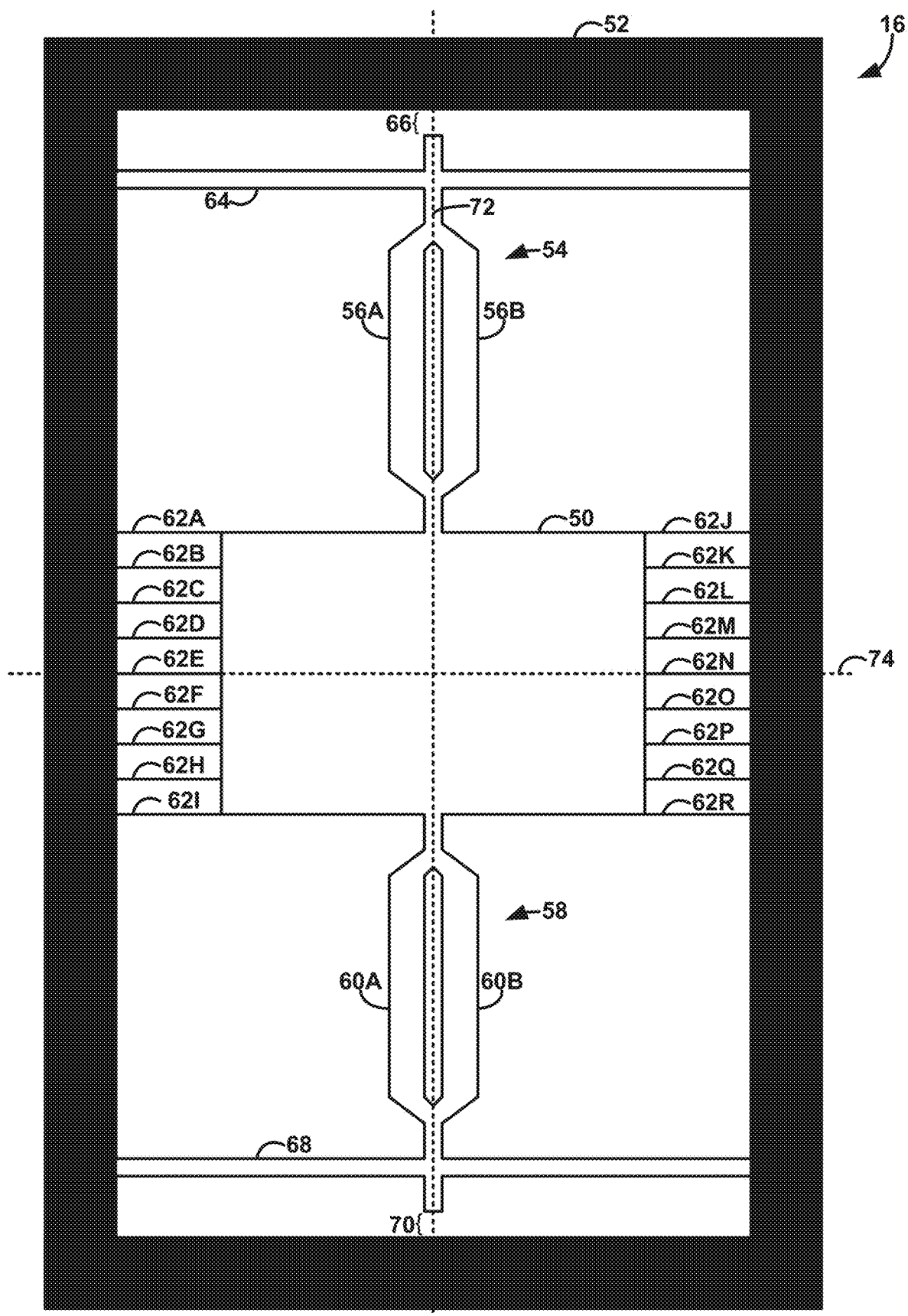
FIG. 3 illustrates a conceptual diagram of the proof mass assembly of FIG. 1 including a proof mass suspended within a frame by a first doubled ended tuning fork (DETF) structure, a second DETF structure, and a set of tethers, in accordance with one or more techniques of this disclosure.

FIG. 3 illustrates a conceptual diagram of proof mass assembly 16 including a proof mass 50 suspended within a frame 52 by a first DETF structure 54, a second DETF structure 58, and a set of tethers 62A-62R, in accordance with one or more techniques of this disclosure. As illustrated in FIG. 3, proof mass assembly 16 includes proof mass 50, frame 52, first DETF structure 54 including a first pair of mechanical beams 56A, 56B (collectively, "first pair of mechanical beams 56"), second DETF structure 58 including a second pair of mechanical beams 60A, 60B (collectively, "second pair of mechanical beams 60"), tethers 62A-62R (collectively, "tethers 62"), first distal tine 64, and second distal tine 68. Proof mass assembly 16 is aligned relative to proof mass displacement axis 72 and proof mass resting plane 74, as illustrated in FIG. 3.

Proof mass assembly 16 is a mechanical component of electro-opto-mechanical system 10. Because system 10 measures acceleration, which is a rate in which a velocity of an object changes over time, it may be beneficial to include proof mass assembly 16 so that acceleration can be measured based on a physical object such as proof mass 50. For example, system 10, which includes proof mass assembly 16 may be fixed to or included within an object. Consequently, as the object accelerates at an acceleration value, proof mass assembly 16 may also accelerate at the acceleration value. Acceleration may affect a position of proof mass 50 within frame 52 relative to proof mass displacement axis 72 and proof mass resting plane 74. For example, non-zero acceleration may cause proof mass 50 to be displaced from proof mass resting plane 74 along proof mass displacement axis 72. As described herein, if proof mass 50 is "displaced," a center of mass of proof mass 50 is displaced relative to frame 52. Increasing a magnitude of acceleration may cause the displacement of proof mass 50 along proof mass displacement axis 72 to increase. Additionally, decreasing a magnitude of acceleration may cause the displacement of proof mass 50 along proof mass displacement axis 72 to decrease.

In some examples, proof mass 50 takes the form of a patterned thin film, where the thin film has a mass within a range between 100 nanograms (ng) and 10,000 ng. Additionally, in some cases, the thin film has a thickness within a range between 1 nm and 5,000 nm. Proof mass 50 may be suspended within frame 52 along proof mass displacement axis 72 by first DETF structure 54 and second DETF structure 58 (collectively, "DETF structures 54, 58"). First DETF structure 54 and second DETF structure 58 may each have a high level of stiffness. For example, a scale factor of each of first DETF structure 54 and second DETF structure 58 may be within a range between 0.1 parts per million per gravitational force equivalent (ppm/G) and 10 ppm/G. In this way, proof mass assembly 16 may include a very light proof mass 50 which is secured by very stiff DETF structures 54, 58. As such, a very high acceleration (e.g., 100,000 $m/s^2$) may cause proof mass 50 to be displaced along the proof mass displacement axis 72 by a very small displacement value, for example. In some examples, proof mass 50 is displaced along the proof mass displacement axis 72 by a displacement value of up to 100 nm.

To generate acceleration values indicative of the acceleration of the object in which system 10 is fixed to, system 10 may quantify, using optical signals, the displacement of proof mass 50 within frame 52. To quantify the displacement of proof mass 50, system 10 may measure and analyze mechanical properties of DETF structures 54, 58, such as mechanical vibrating frequency values corresponding to DETF structures 54, 58. Indeed, since DETF structures 54, 58 suspend proof mass 50, the mechanical vibrating frequencies of DETF structures 54, 58 may be affected due to a displacement of proof mass 50. For example, a displacement of proof mass 50 towards first DETF structure 54 and away from second DETF structure 58 may cause proof mass 50 to apply a compression force to first DETF structure 54 and apply a tension force to second DETF structure 58. Such a compression force may cause the mechanical vibration frequency of first DETF structure 54 to decrease and such a tension force may cause the mechanical vibration force of second DETF structure 58 to increase. Changes in the mechanical vibration frequencies of DETF structures 54, 58 may, in some examples, be proportional to the displacement of proof mass 50 relative to frame 52 in the direction of proof mass displacement axis 72. In some examples, System 10 may measure changes in the mechanical vibration frequencies of DETF structures 54, 58 by transmitting modulated optical signals through DETF structures 54, 58.

First DETF structure 54 may include, for example, the first pair of mechanical beams 56 separated by a gap. The first pair of mechanical beams 56 may include photonic crystal mechanical beams that are configured for guiding a first modulated optical signal while first DETF structure 54 is oscillating at a first mechanical vibrating frequency. In some cases, the first modulated optical signal is emitted by light-emitting device 12 (illustrated in FIG. 1), and the first modulated optical signal itself induces vibration in first DETF structure 54. Additionally, the vibration of the first DETF structure 54 may affect certain properties of the first modulated optical signal such that the mechanical vibrating frequency of the first DETF structure 54 is reflected in the first modulated optical signal. In this way, the first modulated optical signal may cause the mechanical vibration in the first DETF structure 54 and enable system 10 to measure the mechanical vibration frequency of the first DETF structure 54 based on the first modulated optical signal.

Additionally, second DETF structure 58 may include, for example, the second pair of mechanical beams 60 separated by a gap. The second pair of mechanical beams 60 may include photonic crystal mechanical beams that are configured for guiding a second modulated optical signal while second DETF structure 58 is oscillating at a second mechanical vibrating frequency. In some cases, the second modulated optical signal is emitted by light-emitting device 12 (illustrated in FIG. 1), and the second modulated optical signal itself induces vibration in second DETF structure 58. Additionally, the vibration of the second DETF structure 58 may affect certain properties of the second modulated optical signal such that the mechanical vibrating frequency of the second DETF structure 58 is reflected in the second modulated optical signal. In this way, the second modulated optical signal may cause the mechanical vibration to occur in the second DETF structure 58 and enable system 10 to measure the mechanical vibration frequency of the second DETF structure 58 based on the second modulated optical signal.

Proof mass 50 may be fixed to frame 52 by tethers 62. In some examples, tethers 62 may suspend proof mass 50 in proof mass resting plane 74 such that the center of mass of proof mass 50 does not move within proof mass resting plane 74 relative to frame 52. Proof mass displacement axis 72 may represent a single axis (e.g., x-axis) of a Cartesian space, and proof mass resting plane 74 may represent two axes (e.g., y-axis and z-axis) of the Cartesian space. Since tethers 62 may restrict proof mass 50 from being displaced relative to proof mass resting plane 74, in some examples, proof mass 50 may only be displaced along the proof mass displacement axis 72. System 10 may measure an acceleration based on mechanical vibrating frequencies of DETF structures 54, 58, where the mechanical vibrating frequencies are related to an amount of displacement of proof mass 50 along proof mass displacement axis 72. In this way, the acceleration determined by system 10 may be an acceleration relative to proof mass displacement axis 72.

First DETF structure 54 may include a proximal end that is proximate to proof mass 50, and a distal end that is separated from frame 52 by a first gap 66. First distal tine 64 may help to suspend first DETF structure 54 within frame 52 such that the first DETF structure 54 is perpendicular to proof mass resting plane 74. In some examples, first distal tine 64 extends perpendicularly to proof mass displacement axis 72 between two sidewalls of frame 52. An optical signal may travel through frame 52 via a first optical fiber (not illustrated in FIG. 3), the optical signal being coupled across first gap 66 to first DETF structure 54.

Second DETF structure 58 may include a proximal end that is proximate to proof mass 50, and a distal end that is separated from frame 52 by a second gap 70. Second distal tine 68 may help to suspend first DETF structure 58 within frame 52 such that the second DETF structure 58 is perpendicular to proof mass resting plane 74. In some examples, second distal tine 68 extends perpendicularly to proof mass displacement axis 72 between two sidewalls of frame 52. An optical signal may travel through frame 52 via a second optical fiber (not illustrated in FIG. 3), the optical signal being coupled across second gap 70 to second DETF structure 58.

Figure 4:
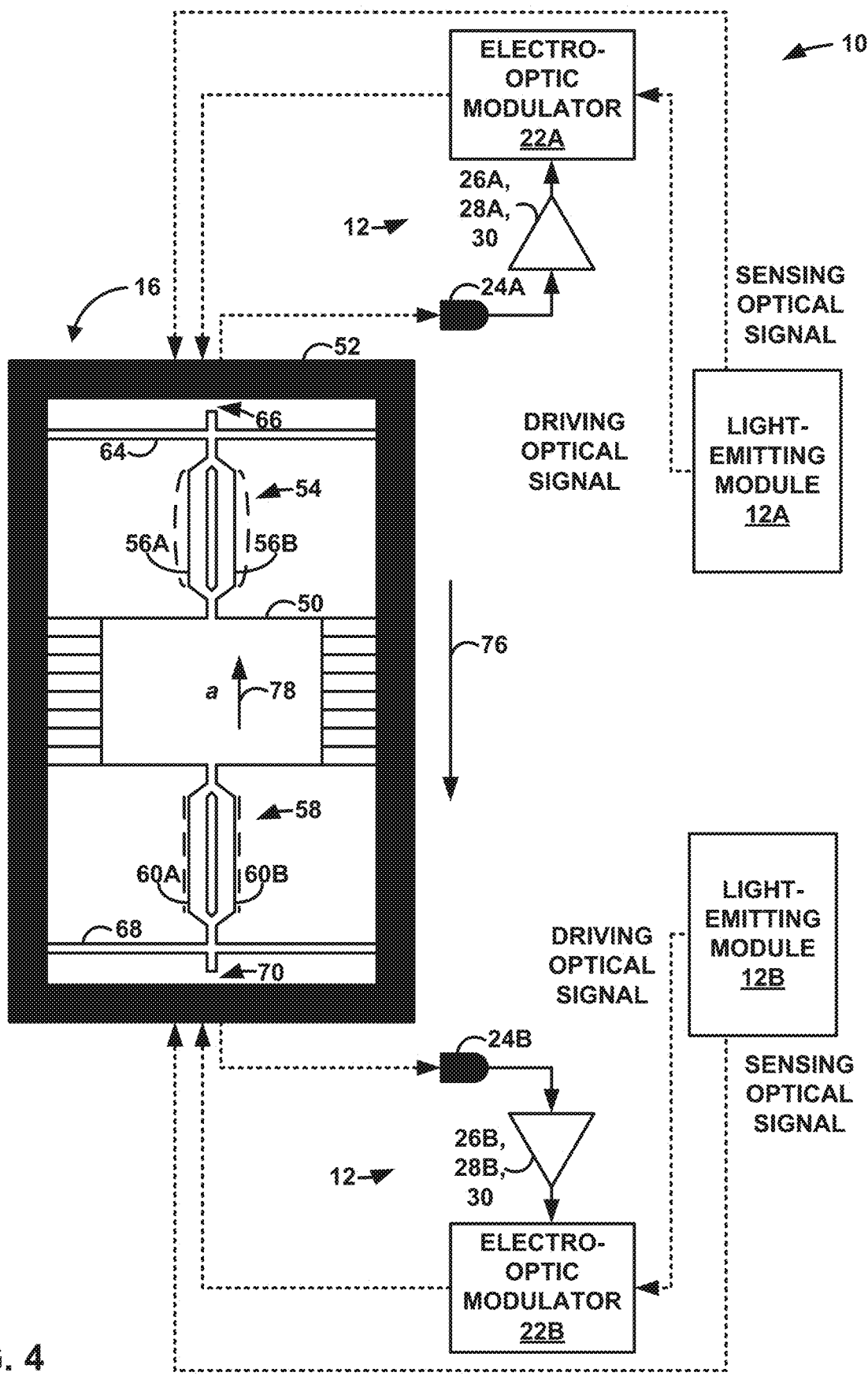
FIG. 4 illustrates a conceptual diagram of the electro-opto-mechanical system of FIG. 1, in accordance with one or more techniques of this disclosure.

FIG. 4 illustrates a conceptual diagram of system 10, in accordance with one or more techniques of this disclosure. The conceptual diagram of FIG. 4 includes light-emitting devices 12, components of circuit 14, and proof mass assembly 16. In some examples, an object may be fixed to system 10. The object, in some cases, may accelerate. System 10, including proof mass assembly 16, may accelerate with the object. As proof mass assembly 16 accelerates, proof mass 50 may be displaced relative to frame 52. In the example illustrated in FIG. 4, if proof mass assembly 16 accelerates in direction 78, proof mass 50 is displaced in direction 78. Direction 78, in some examples, is aligned with a proof mass displacement axis (e.g., proof mass displacement axis 72 of FIG. 3.

As proof mass 50 is displaced in direction 78 relative to frame 52, proof mass 50 applies a compression force to first DETF structure 54, and proof mass 50 applies a tension force to second DETF structure 58. Such forces may affect mechanical vibrating frequencies of DETF structures 54, 58, where mechanical vibration is induced in first DETF structure 54 and second DETF structure 58 by electro-optic modulator 22A and electro-optic modulator 22B, respectively. For example, the compression force applied to first DETF structure 54 may cause the mechanical vibration frequency of first DETF structure 54 to decrease, and the tension force applied to second DETF structure 58 may cause the mechanical vibration frequency of second DETF structure 58 to increase.

Light-emitting devices 12 may emit a driving optical signal to EOMs 22 and a sensing optical signal to proof mass assembly 16. For example, each of light-emitting devices 12 may be configured to generate a sensing optical signal that interacts with proof mass assembly 16 and, in response to interacting with the proof mass assembly 16, is impressed with one or more of a modulation in phase or frequency of mechanical vibrations in proof mass assembly 16 and a driving optical signal that is modulated by EOMs 22 and that stimulates mechanical vibrations in proof mass assembly 16. In this way, the driving optical signal may provide driving modulation at proof mass assembly and feedback unit 26A, 26B may use the sensing optical signal that interacts with proof mass assembly 16 while the driving optical signal drives the mechanical vibration frequency at proof mass assembly 16.

In turn, EOM 22A and EOM 22B may modulate a respective driving optical signal according to a processed electrical signals produced by feedback unit 26A and feedback unit 26B, respectively. As such, EOM 22A may produce a first modulated optical signal for driving a mechanical response in proof mass assembly 16 and EOM 22B may produce a second modulated optical signal for driving a mechanical response in proof mass assembly 16. EOM 22A, for example, may transmit the first modulated optical signal to proof mass assembly 16. The first modulated optical signal may cross frame 52. In some examples, frame 52 includes an aperture or another opening bridged by a first optical fiber which allows the first modulated optical signal to pass. Additionally, the first modulated optical signal may couple across first gap 66 to the first DETF structure 54. The first modulated optical signal for driving a mechanical response in proof mass assembly 16 may propagate through first DETF structure 54, inducing mechanical vibration in first DETF structure 54. In some examples, the first modulated optical signal propagates the length of first DETF structure 54 along mechanical beam 56A and along mechanical beam 56B. It should be understood that mechanical beam 56A and mechanical beam 56B are not individual optical channels but instead represent structures for co-propagating optical signals.

By propagating the length of first DETF structure 54, the first sensing optical signal may retain information indicative of mechanical properties (e.g., the mechanical vibration frequency) of first DETF structure 54. After the first sensing optical signal propagates through first DETF structure 54, the first sensing optical signal may exit proof mass assembly 16 via first gap 66 and the first optical fiber of frame 52.

After exiting proof mass assembly 16, the first sensing optical signal, which may include fluctuations in amplitude and/or frequency (e.g., fluctuations in the mechanical resonance frequency by which the first modulated optical signal is modulated), may arrive at photoreceiver 24A. Photoreceivers 24A convert the first modulated optical signal into a set of electrical signals for rejecting noise in light-emitting device 12A and for driving EOM 22A to a mechanical resonance of proof mass assembly 16. Frequency counter 28A may determine a first frequency value corresponding to the first processed electrical signal, where the first frequency value is indicative of the mechanical vibrating frequency of the first DETF structure 54. Processing circuitry 30 may subtract a baseline frequency value from the first frequency value to obtain a first frequency difference value and calculate a first acceleration value based on the first frequency difference value. EOM 22A may use the first processed electrical signal to modulate the optical signal emitted by light-emitting device 12.

EOM 22B, for example, may transmit the second modulated optical signal to proof mass assembly 16. The second modulated optical signal may cross frame 52. In some examples, frame 52 includes an aperture or another opening bridged by a second optical fiber which allows the second modulated optical signal to pass. Additionally, the second modulated optical signal may couple across second gap 70 to the second DETF structure 58. The second modulated optical signal may propagate through second DETF structure 58, inducing mechanical vibration in second DETF structure 58. In some examples, the second modulated optical signal propagates the length of second DETF structure 58 along mechanical beam 60A and along mechanical beam 60B. It should be understood that mechanical beam 60A and mechanical beam 60B are not individual optical channels but instead represent structures for co-propagating optical signals. By propagating the length of second DETF structure 58, the second modulated optical signal may retain information indicative of mechanical properties (e.g., the mechanical vibration frequency) of second DETF structure 58. After the second modulated optical signal propagates through second DETF structure 58, the second modulated optical signal may exit proof mass assembly 16 via second gap 70 and the second optical fiber of frame 52.

After exiting proof mass assembly 16, the second sensing optical signal, which may include thermal noise, may arrive at photoreceivers 24B. Photoreceivers 24B convert the second modulated optical signal into a set of electrical signals for rejecting noise in light-emitting device 12B and a second electrical signal for driving EOM 22B to a mechanical resonance of proof mass assembly 16. Frequency counter 28B may determine a second frequency value corresponding to the second processed electrical signal, where the second frequency value is indicative of the mechanical vibrating frequency of the second DETF structure 58. Processing circuitry 30 may subtract a baseline frequency value from the second frequency value to obtain a second frequency difference value and calculate a second acceleration value based on the second frequency difference value. EOM 22B may use the second processed electrical signal to modulate the optical signal emitted by light-emitting device 12.

Figure 5:
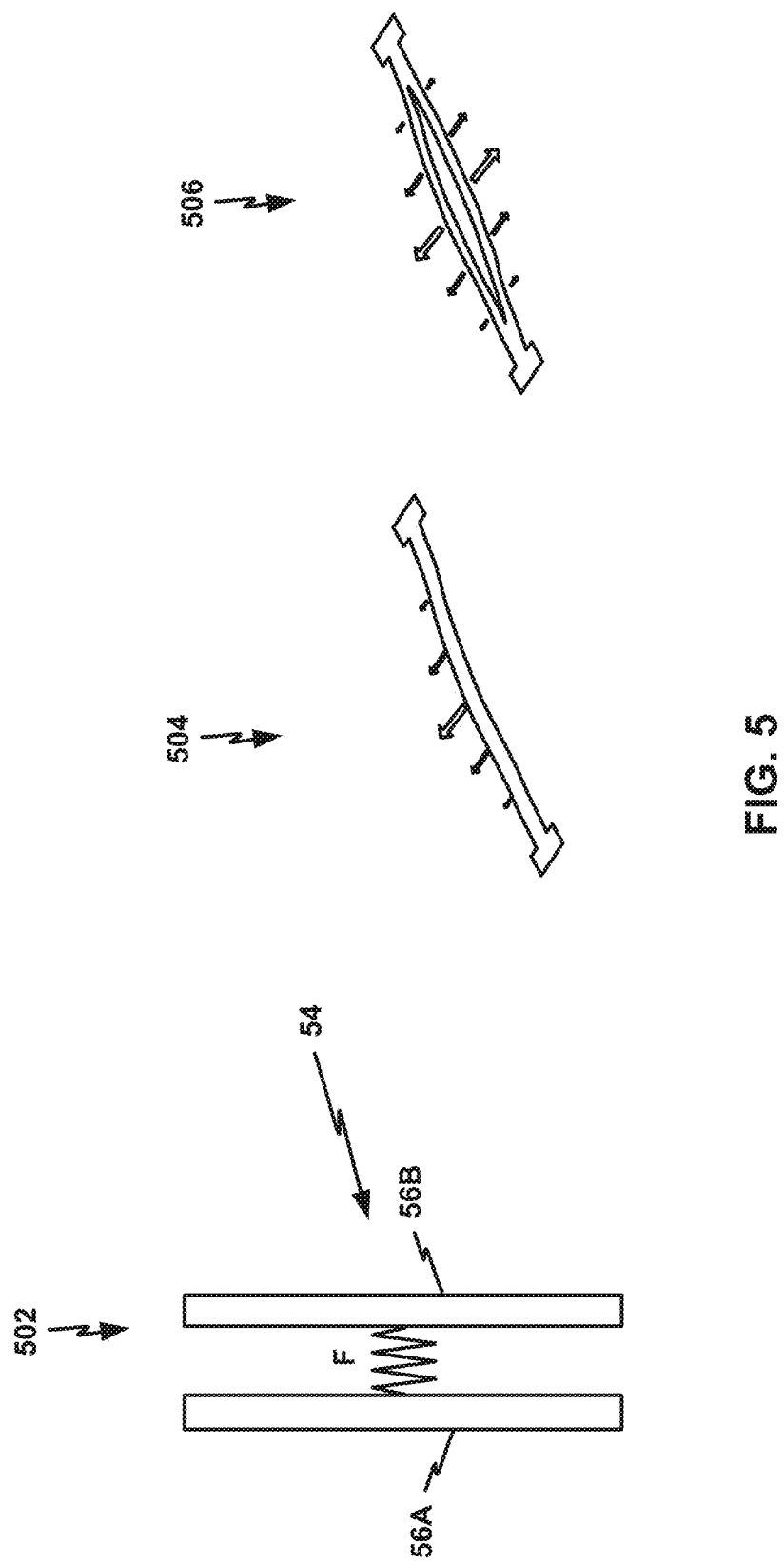
FIG. 5 depicts additional aspects of the electro-opto-mechanical system of FIG. 1, in accordance with one or more techniques of this disclosure.

FIG. 5 depicts additional aspects of system 10, in accordance with one or more techniques of this disclosure. For example, FIG. 5 illustrates the first DETF structure 54 including the first pair of mechanical beams 56. The optical signal emitted by light-emitting device 12 may induce a force between the first pair of mechanical beams 56, and the force may be modelled by a spring force. FIG. 5 illustrates a spring force provided by laser light between beams in an optical zipper in the gap between photonic crystal mechanical beams 56A, 56B of DETF structure 54 (502), a perspective view depiction of vibration modes in beams in an optical zipper in one common direction together (504), and a perspective view depiction of vibration modes in beams in an optical "zipper" in opposing directions of oscillation (506).

Figure 6:
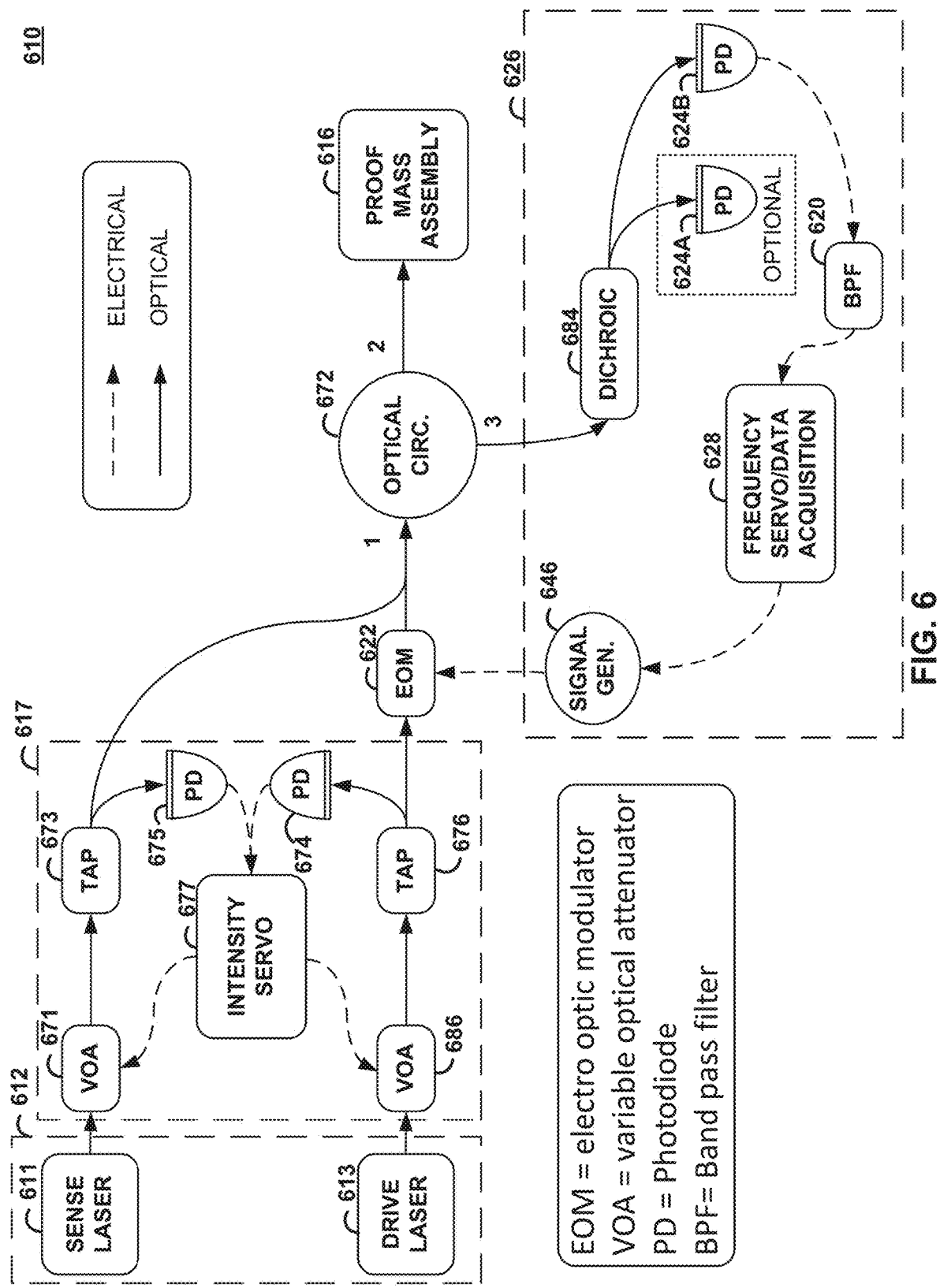
FIG. 6 is a conceptual diagram illustrating example techniques for reducing drive feedthrough in optomechanical devices, in accordance with one or more techniques of this disclosure.

FIG. 6 is a conceptual diagram illustrating example techniques for reducing drive feedthrough in optomechanical devices, in accordance with one or more techniques of this disclosure. FIG. 6 is discussed with reference to FIGS. 1-5 for example purposes only. As shown, electro-opto-mechanical system 610, which may be an example of system 10, may include light-emitting device 612, intensity stabilizer 617, EOM 622, optical circulator 672, assembly 616, and feedback unit 626. Assembly 616 may include a first beam structure and a second beam structure with elements configured for two optical resonances (see FIGS. 13A, 13B, 14-19). For example, assembly 616 may include a first element and second element help to spread out two optical resonances such that a sensing optical signal and a driving optical signal may be easily filtered (e.g., using a Dichroic).

Light-emitting device 612 may include sense laser 611 and drive laser 613. Sense laser 611 and drive laser 613 may be output at different intensities. For example, sense laser 611 may be configured to generate a sensing optical signal such that the sense optical signal interacts with the proof mass assembly and, in response to interacting with the proof mass assembly, is impressed with one or more of a modulation in phase of mechanical vibrations in the proof mass assembly and a frequency of mechanical vibrations in the proof mass assembly. In contrast, drive laser 613 may be configured to generate a driving optical signal such that the driving optical signal stimulates mechanical vibrations in assembly 616. For instance, drive laser 613 may be configured to generate the drive optical signal with an amplitude that is greater than ten times an amplitude of a sense optical signal output by sense laser 611.

Sense laser 611 and drive laser 613 may be two intensity stabilized lasers, each tuned to a slightly different frequency. For example, sense laser 611 may be tuned to vopt+$\Gamma$/4 and drive laser 613 may be tuned to vopt−$\Gamma$/4, where vopt is the optical resonance frequency and $\Gamma$ is the FWHM. In another example, drive laser 613 may be tuned to vopt+$\Gamma$/4 and sense laser 611 may be tuned to vopt−$\Gamma$/4.

Sense laser 611 and drive laser 613 may be each tuned to a slightly different frequency that is offset from the optical resonance frequency. For example, Sense laser 611 may be tuned to vopt+F/4+$\Delta$ and drive laser 613 may be tuned to vopt+$\Gamma$/4−$\Delta$, where A is a resolvable frequency difference that is larger than the mechanical frequency. In some examples, drive laser 613 may be tuned to vopt+F/4+$\Delta$ and sense laser 611 may be tuned to vopt+$\Gamma$/4−$\Delta$. In some examples, Sense laser 611 may be tuned to vopt−F/4+$\Delta$ and drive laser 613 may be tuned to vopt−$\Gamma$/4−$\Delta$. In some examples, drive laser 613 may be tuned to vopt−F/4+$\Delta$ and sense laser 611 may be tuned to vopt−$\Gamma$/4−$\Delta$, where vopt is the optical resonance frequency and $\Gamma$ is the FWHM.

Intensity stabilizer 617 may be configured to regulate an intensity of the optical signal output by sense laser 611 to regulate an intensity of the optical signal to a predetermined light intensity value. For example, the optical signal output by sense laser 611 passes through a Variable Optical Attenuator (VOA) 671, which may be configured to attenuate a portion of the optical signal. Tap 673 may be configured to output a first portion of the optical signal output from VOA 671 to photodiode 675 and a second portion of the optical signal output from VOA 671 to optical circulator 672. In this example, intensity servo 677 may be configured to use an electrical signal output by photodiode 675 to stabilize the overall light level of the optical signal.

Intensity stabilizer 617 may be configured to regulate an intensity of the optical signal output by drive laser 613 to regulate an intensity of the optical signal to a predetermined light intensity value. For example, the optical signal output by drive laser 613 passes through VOA 686, which may be configured to attenuate a portion of the optical signal. Tap 676 may be configured to output a first portion of the optical signal output from VOA 686 to photodiode 674 and a second portion of the optical signal output from VOA 686 to optical EOM 622. In this example, intensity servo 677 may be configured to use an electrical signal output by photodiode 674 to stabilize the overall light level of the optical signal.

Intensity servo 677 may be configured to regulate an intensity of the optical signal output by sense laser 611 to a first predetermined light intensity value before outputting the optical signal to assembly 616. In some examples, intensity servo 677 may be configured to regulate an intensity of the optical signal output by drive laser 613 to a second predetermined light intensity value before outputting the optical signal to assembly 616. In some examples, the second predetermined light intensity value may be larger (e.g., more than 10 times, more than 20 times, etc.) than the first predetermined light intensity value.

EOM 622 may be configured to receive the optical signal output by tap 676 (e.g., the driving optical signal) and modulate the optical signal at a frequency near the frequency of the mechanical resonance of assembly 616. For example, EOM 622 may be configured to modulate the optical signal output by tap 676 near the frequency of the mechanical resonance of assembly 616 using an electrical signal generated by feedback unit 626.

Optical circulator 672 may be configured to output an optical signal (e.g., a driving optical signal) output by EOM 622 and an optical signal output (e.g., a sensing optical signal) by tap 673 to assembly 616 and receive an optical signal reflected from assembly 616. For example, an optical signal output by sense laser 611 and stabilized by intensity stabilizer 617 and an optical signal output by drive laser 613 and stabilized by intensity stabilizer 617 are combined to generate a combined optical signal and the combined optical signal passes into port '1' of optical circulator 672 and out of port '2' of optical circulator 672, where the modulated optical signal interacts with assembly 616 (e.g., a zipper cavity measured in reflection). Assembly 616 may spread out two optical resonances such that a sensing optical signal and a driving optical signal are separated by at least 50 nm.

After reflection back into port '2' of optical circulator 672, the optical signal is output from port '3' of optical circulator 672 to feedback unit 626. Feedback unit 626 may be configured to use the optical signal resulting from assembly 616 to drive the mechanical response of assembly 616.

As shown, feedback unit 626 may include dichroic 684, photodiode 624A, 624B (collectively, "photodiodes 624" (photodiode 624A is optional)), Band-Pass Filter (BPF) 620, frequency servo and data acquisition module 628, and signal generator 646. Frequency servo and data acquisition module 628 may be an example of drivers 47A, 47B.

Dichroic 648 may be configured to separate the drive and sense optical signals, which are at different wavelengths. For example, dichroic 648 may be configured to output a first optical signal corresponding to vopt+$\Gamma$/4 and a second optical signal corresponding to vopt−$\Gamma$/4 or output a first optical signal corresponding to vopt−$\Gamma$/4 and a second optical signal corresponding to vopt+$\Gamma$/4. In some examples, dichroic 648 may be configured to output a first optical signal corresponding to vopt+F/4+$\Delta$ and a second optical signal corresponding to vopt+$\Gamma$/4−$\Delta$ or output a first optical signal corresponding to vopt+$\Gamma$/4−$\Delta$ and a second optical signal corresponding to vopt+F/4+$\Delta$. In some examples, dichroic 648 may be configured to output a first optical signal corresponding to vopt−$\Gamma$/4+$\Delta$ and a second optical signal corresponding to vopt−$\Gamma$/4−$\Delta$ or output a first optical signal corresponding to vopt−$\Gamma$/4−$\Delta$ and a second optical signal corresponding to vopt−$\Gamma$/4+A.

Photodiode 624A may be configured to convert the first portion of the optical signal output by dichroic 684 into a first electrical signal. Similarly, photodiode 624B may be configured to convert the second portion of the optical signal output by dichroic 684 into a second electrical signal.

BPF 620 may be configured to pass electrical signals within a band of frequencies around the mechanical frequency of assembly 616. For example, BPF 620 may be configured to pass electrical signals within a band of frequencies at about 1 MHz.

Frequency servo and data acquisition module 628 may be configured to cause EOM 622 to drive the optical signal output by tap 676 to a mechanical resonance of assembly 616. For example, signal generator 646 may be configured to generate a mechanical resonance feedback signal that causes EOM 622 to operate near or at the mechanical resonance of assembly 616. For example, signal generator 646 may generate a mechanical resonance feedback signal using signal generator 646 to set to the mechanical resonance of assembly 616. Frequency servo and data acquisition module 628 may determine a first frequency value to determine an acceleration value for assembly 616. Frequency servo and data acquisition module 628 may be configured to measure, using the mechanical resonance feedback signal, an acceleration at assembly 616.

In accordance with techniques described herein, drive laser 613 may be configured to generate an optical signal that passes through EOM 622 where light is modulated at the mechanical resonance frequency. The optical signal output by drive laser 613 is combined with an optical signal output by sense laser 611, and the combination of the optical signal output by drive laser 613 and optical signal output by sense laser 611 is passed through optical circulator 672 to assembly 616 (e.g., an optomechanical accelerometer, which may include a photonic zipper cavity). The optical signal output by drive laser 613 interacts with assembly 616 and stimulates mechanical vibrations in assembly 616. The optical signal output by sense laser 611 interacts with assembly 616, and has impressed on the optical signal a modulation in phase and/or frequency due to the mechanical vibrations stimulated by the optical signal output by drive laser 613, but also carrying information about the frequency and phase of the mechanical vibrations, including, for example, one or more shifts in the mechanical resonance due to acceleration of assembly 616. Both optical signals generated by sense laser 611 and drive laser 613 leave assembly 616 (in reflection or transmission). In the case of reflection, the optical signal is passed back through optical circulator 672 and to dichroic 684 with sufficient frequency selectivity to separate the drive and sense optical fields, which are at different wavelengths. For example, assembly 616 may spread out two optical resonances such that a sensing optical signal and a driving optical signal are separated by at least 50 nm. Photodiode 624B, BPF 620, frequency servo and data acquisition module 628, and signal generator 646, may be configured to perform subsequent detection and processing of only the optical signal output sense laser 611, thereby helping to provide measure of acceleration which is not contaminated by feed-through. In closed loop oscillator operation, feedback unit 626 may be configured to electronically detect and process the optical signal from sense laser 611 and control signal generator 646 to drive the EOM 622 to create a modulated drive field. In some examples (e.g., open loop, or scanning, or Phase-Locked-Loop), feedback unit 626 may be configured to derive the signal to be applied to EOM 622 from an independent frequency synthesizer.

Figure 7:
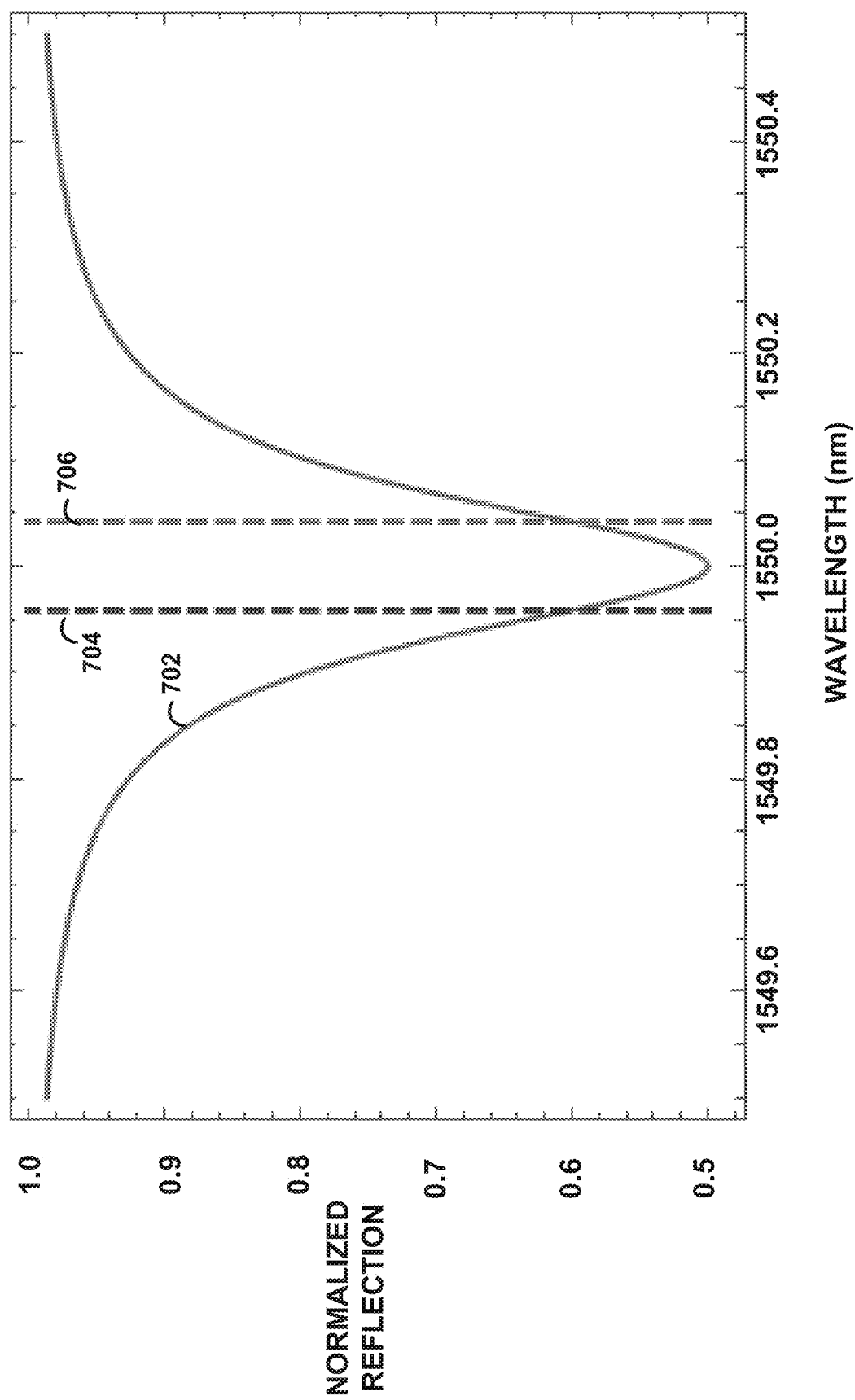
FIG. 7 is a conceptual diagram an example first optical response of a first optical frequency component and a second optical frequency component, in accordance with one or more techniques of this disclosure.

FIG. 7 is a conceptual diagram an example first optical response of a first optical frequency component and a second optical frequency component, in accordance with one or more techniques of this disclosure. FIG. 7 is discussed with reference to FIGS. 1-6 for example purposes only. The abscissa axis (e.g., horizontal axis) of FIG. 7 represents laser wavelength in nanometers (nm) and the ordinate axis (e.g., vertical axis) of FIG. 7 represents a normalized reflection 702. In the example of FIG. 7, which may be useful for narrow optical resonances, a laser (e.g., drive laser or sense laser) may be set to first frequency 704, which is tuned to vopt+$\Gamma$/4 and the other laser (e.g., sense laser or drive laser) is tuned to vopt−$\Gamma$/4, where vopt is the optical resonance frequency and $\Gamma$ is the FWHM.

Figure 8:
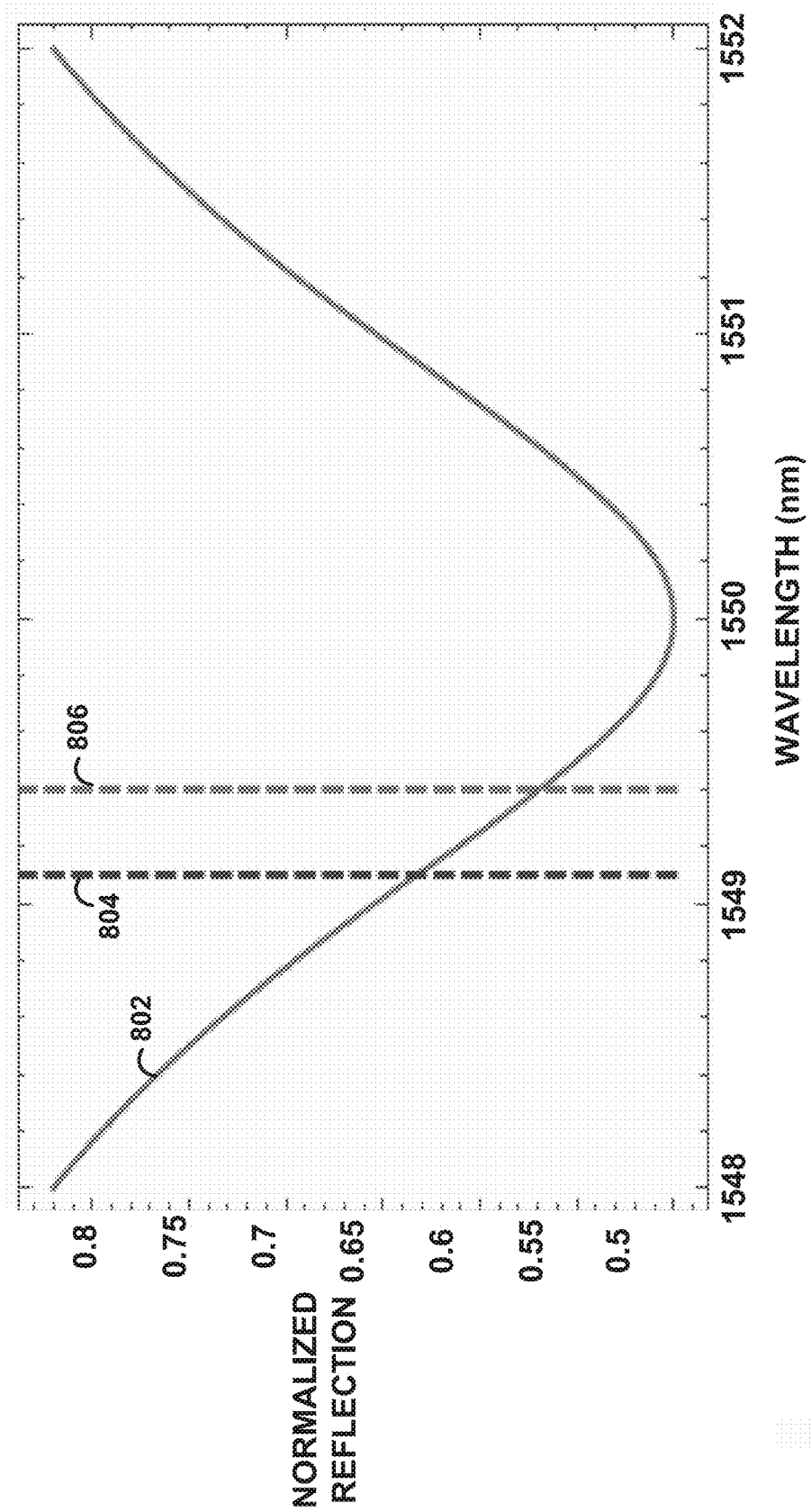
FIG. 8 is a conceptual diagram an example second optical response of a first optical frequency component and a second optical frequency component, in accordance with one or more techniques of this disclosure.

FIG. 8 is a conceptual diagram an example second optical response of a first optical frequency component and a second optical frequency component, in accordance with one or more techniques of this disclosure. FIG. 8 is discussed with reference to FIGS. 1-7 for example purposes only. The abscissa axis (e.g., horizontal axis) of FIG. 8 represents laser wavelength in nanometers (nm) and the ordinate axis (e.g., vertical axis) of FIG. 8 represents a normalized reflection 802. In the example of FIG. 8, a laser (e.g., drive laser or sense laser) may be set to first frequency 804, which is tuned to vopt+$\Gamma$/4−$\Delta$ and the other laser (e.g., sense laser or drive laser) is tuned to vopt+F/4+$\Delta$, where vopt is the optical resonance frequency and $\Gamma$ is the FWHM. In some examples, a laser (e.g., drive laser or sense laser) may be set to first frequency, which is tuned to vopt−$\Gamma$/4−$\Delta$ and the other laser (e.g., sense laser or drive laser) is tuned to vopt−$\Gamma$/4+$\Delta$, where vopt is the optical resonance frequency and $\Gamma$ is the FWHM.

Figure 9:
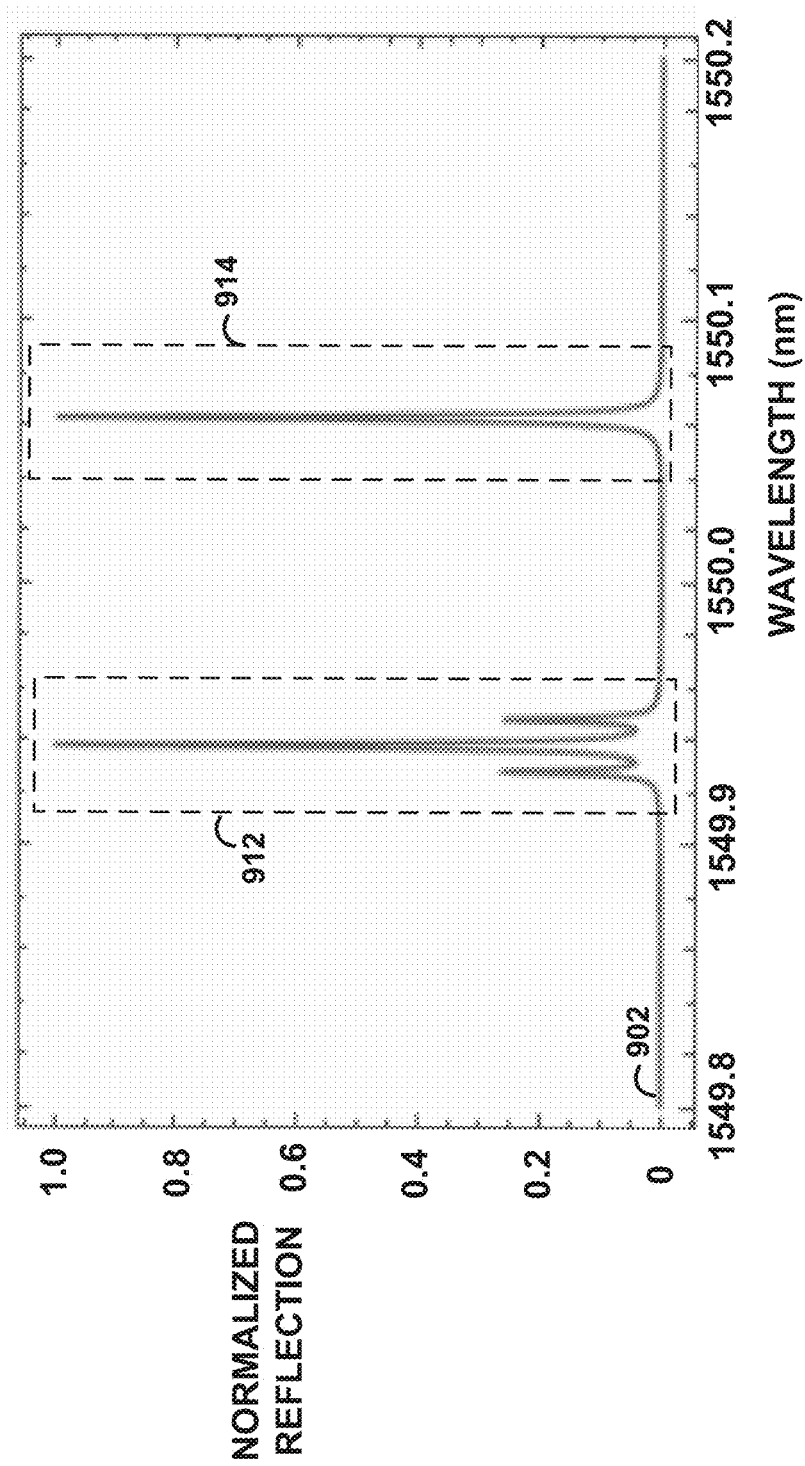
FIG. 9 is a conceptual diagram an example of an optical signal to be applied to a proof mass assembly, in accordance with one or more techniques of this disclosure.

FIG. 9 is a conceptual diagram an example of an optical signal to be applied to a proof mass assembly, in accordance with one or more techniques of this disclosure. FIG. 9 is discussed with reference to FIGS. 1-8 for example purposes only. The abscissa axis (e.g., horizontal axis) of FIG. 9 represents laser wavelength in nanometers (nm) and the ordinate axis (e.g., vertical axis) of FIG. 9 represents a normalized optical signal 902. In the example of FIG. 9, optical signal 912 corresponds to an optical signal output by drive laser 613 before output to optical circulator 672 and after processing by intensity stabilizer 617 and optical signal 914 corresponds to an optical signal output by sense laser 611 before output to optical circulator 672 and after processing by intensity stabilizer 617. Although FIG. 9 illustrates a separation between optical signal 912 and optical signal 914 of less than 1 nm, assembly 616 may further spread out two optical resonances, for example, such that optical signal 912 and optical signal 914 are separated by at least 50 nm.

As shown, optical signal 912 includes a central frequency with deleterious "feed-through" modulation, which may be represented as a lower sideband and an upper sideband. Optical signal 914, however, includes a central frequency with little or no deleterious feed-through modulation.

Figure 10:
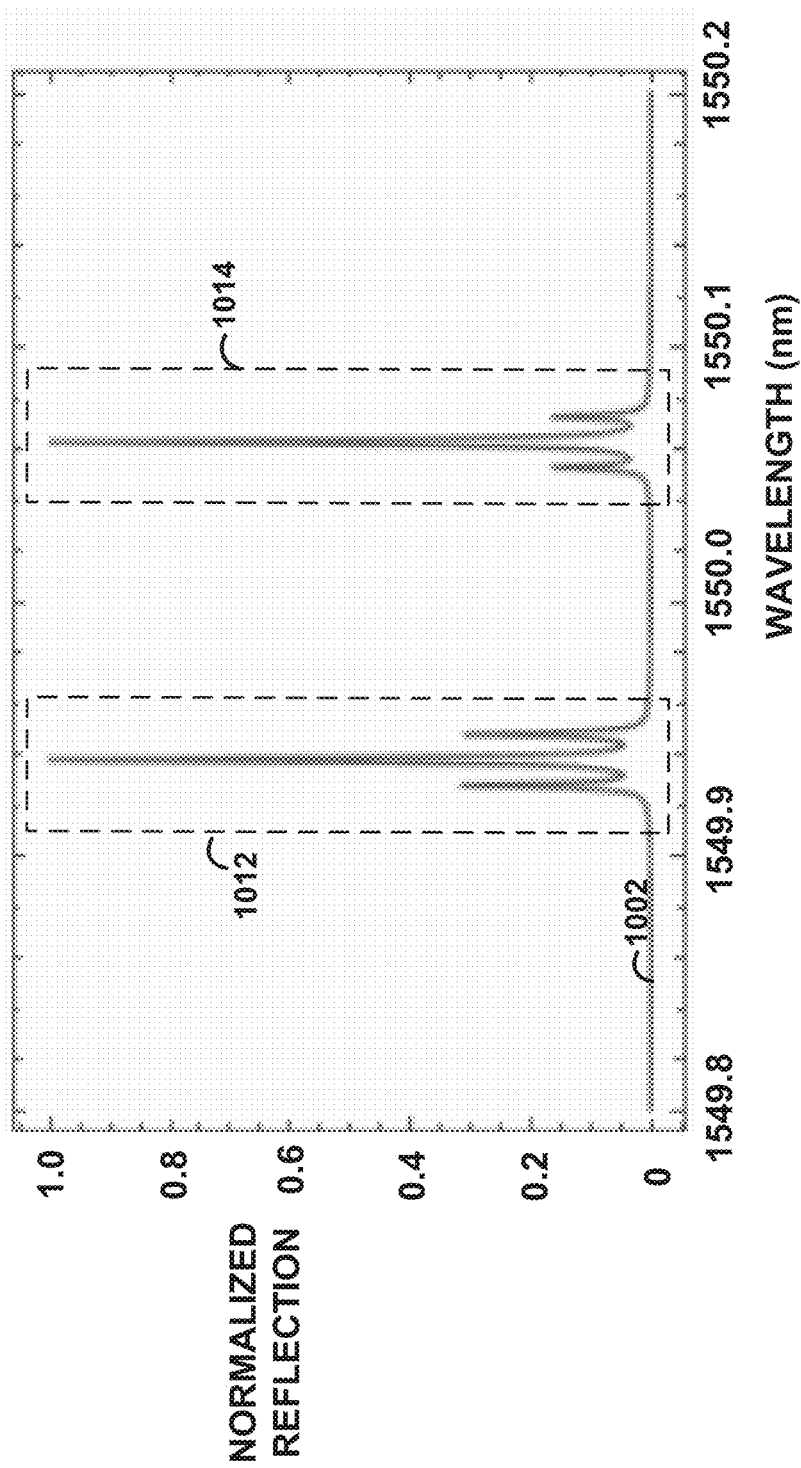
FIG. 10 is a conceptual diagram an example of an optical signal reflected output by a proof mass assembly in response to the optical signal of FIG. 9, in accordance with one or more techniques of this disclosure.

FIG. 10 is a conceptual diagram an example of an optical signal reflected output by a proof mass assembly in response to the optical signal of FIG. 9, in accordance with one or more techniques of this disclosure. FIG. 10 is discussed with reference to FIGS. 1-9 for example purposes only. The abscissa axis (e.g., horizontal axis) of FIG. 10 represents laser wavelength in nanometers (nm) and the ordinate axis (e.g., vertical axis) of FIG. 10 represents a normalized reflection 1002. Although FIG. 10 illustrates a separation between optical signal 1012 and optical signal 1014 of less than 1 nm, assembly 616 may further spread out two optical resonances, for example, such that optical signal 1012 and optical signal 1014 are separated by at least 50 nm. In the example of FIG. 10, optical signal 1012 corresponds to an optical signal output by drive laser 613 before output to dichroic 684 and after output by optical circulator 672 and optical signal 1014 corresponds to an optical signal output by sense laser 611 before output to dichroic 684 and after output by optical circulator 672.

As shown, optical signal 1012 includes a central frequency with deleterious feed-through modulation after interacting with assembly 616. Accordingly, while optical signal 1012 includes an impression from interactions with assembly 616, the impression is obscured by the deleterious feed-through modulation associated with driving the mechanical response at proof mass assembly. In contrast, optical signal 1014 includes a central frequency with small or no deleterious feed-through modulation. As such, optical signal 1014 more clearly includes the impression from interactions with assembly 616, which can be seen as additional sidebands, compared to optical signal 1012.

Figure 11:
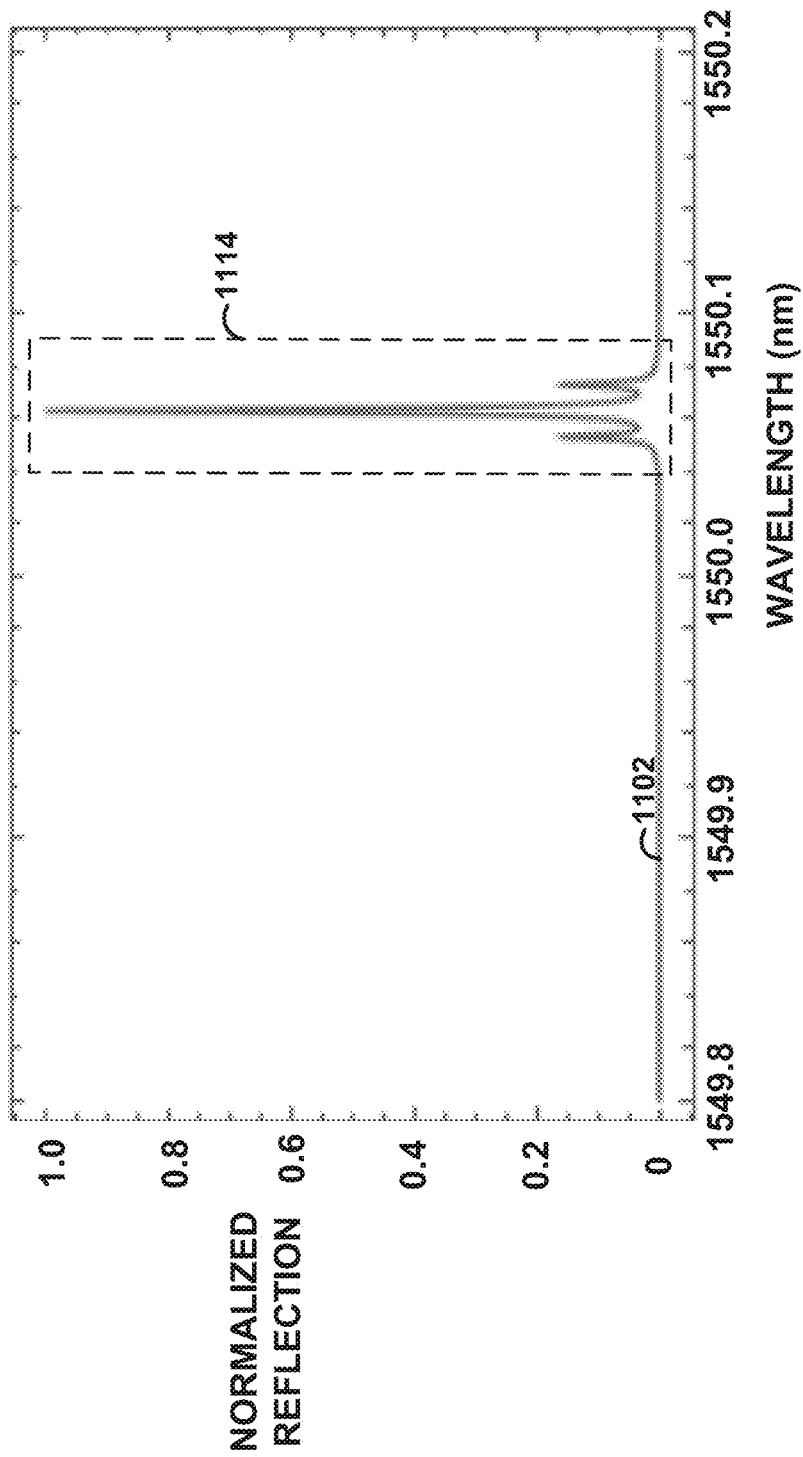
FIG. 11 is a conceptual diagram an example of a filtered optical signal resulting from filtering the optical signal of FIG. 10, in accordance with one or more techniques of this disclosure.

FIG. 11 is a conceptual diagram an example of a filtered optical signal resulting from filtering the optical signal of FIG. 10, in accordance with one or more techniques of this disclosure. FIG. 11 is discussed with reference to FIGS. 1-10 for example purposes only. The abscissa axis (e.g., horizontal axis) of FIG. 11 represents laser wavelength in nanometers (nm) and the ordinate axis (e.g., vertical axis) of FIG. 11 represents a normalized reflection 1102. In the example of FIG. 11, optical signal 1114 corresponds to an optical signal output by sense laser 611 after processing by dichroic 684.

Figure 12:
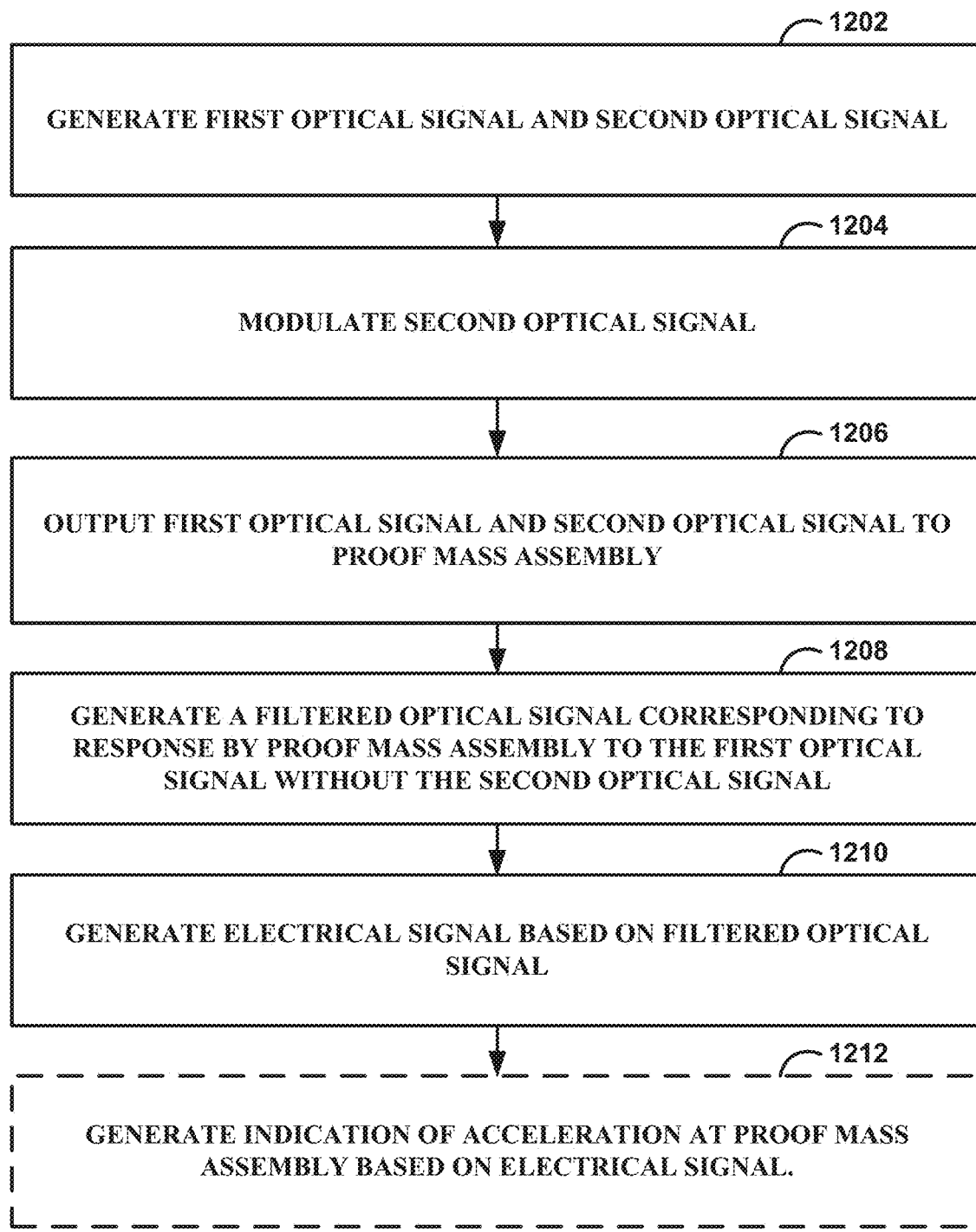
FIG. 12 is a flow diagram illustrating an example for reducing drive feedthrough in optomechanical devices, in accordance with one or more techniques of this disclosure.

FIG. 12 is a flow diagram illustrating an example for reducing drive feedthrough in optomechanical devices, in accordance with one or more techniques of this disclosure. FIG. 12 is discussed with reference to FIGS. 1-11 for example purposes only.

Light-emitting device 612 generates a first optical signal and a second optical signal (1202). In some examples, the first optical signal comprises a frequency different than a frequency of the second optical signal. EOM 622 modulates the second optical signal (1204). Optical circulator 672 outputs the first optical signal and the second optical signal to the proof mass assembly (1206). In some examples, assembly 616 includes first beam structure comprising a first spatial frequency and a second beam structure comprising a second spatial frequency (e.g., see FIGS. 13A, 13B, 14-19). In some examples, a first element of the first beam structure shifts the first spatial frequency of the proof mass assembly by approximately 180 degrees and a second element of the second beam structure shifts the second spatial frequency of the proof mass assembly by approximately 180 degrees such that a first optical resonance and a second optical resonance are generated and spectrally separated by a minimum threshold (e.g., greater than 10 nm, 50 nm, etc.), such that the first optical resonance is probed by the first optical signal interacting with the assembly and the second optical resonance is probed by the second optical signal interacting with the assembly. As used herein approximately 180 degrees may refer to 180 degrees plus or minus a tolerance factor, where the tolerance factor may be between 10 degrees and 0.01 degrees (e.g., 10 degrees, 5 degrees, 1 degree, 0.1 degrees, etc.) Dichroic 684 generates a filtered optical signal corresponding to a response by the proof mass assembly to the first optical signal without the second optical signal (1208). Photodiode 624B generates an electrical signal based on the filtered optical signal (1210). In some examples EOM 622 modulates the second optical signal based on the electrical signal.

Frequency servo and data acquisition module 628 may optionally generate an indication of acceleration at the proof mass assembly based on the electrical signal (1212). However, in other examples, circuitry may generate other indications, such as, for example, an indication of velocity, vibration, rotation, position, or another indication at an assembly.

Figure 13A:
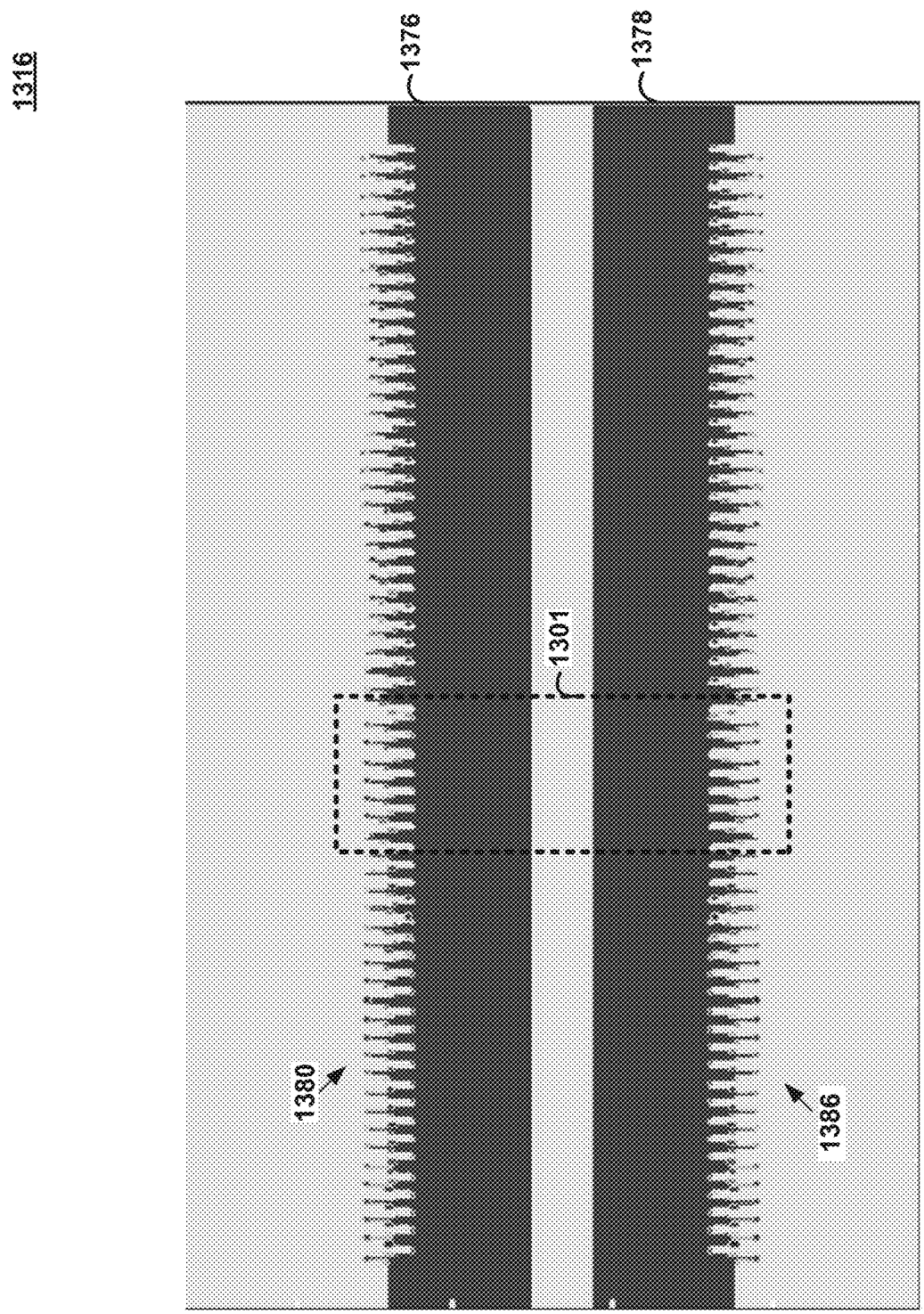
FIG. 13A is a conceptual diagram illustrating a first top view of a first example assembly configured for two optical resonances, in accordance with one or more techniques of this disclosure.
Figure 13B:
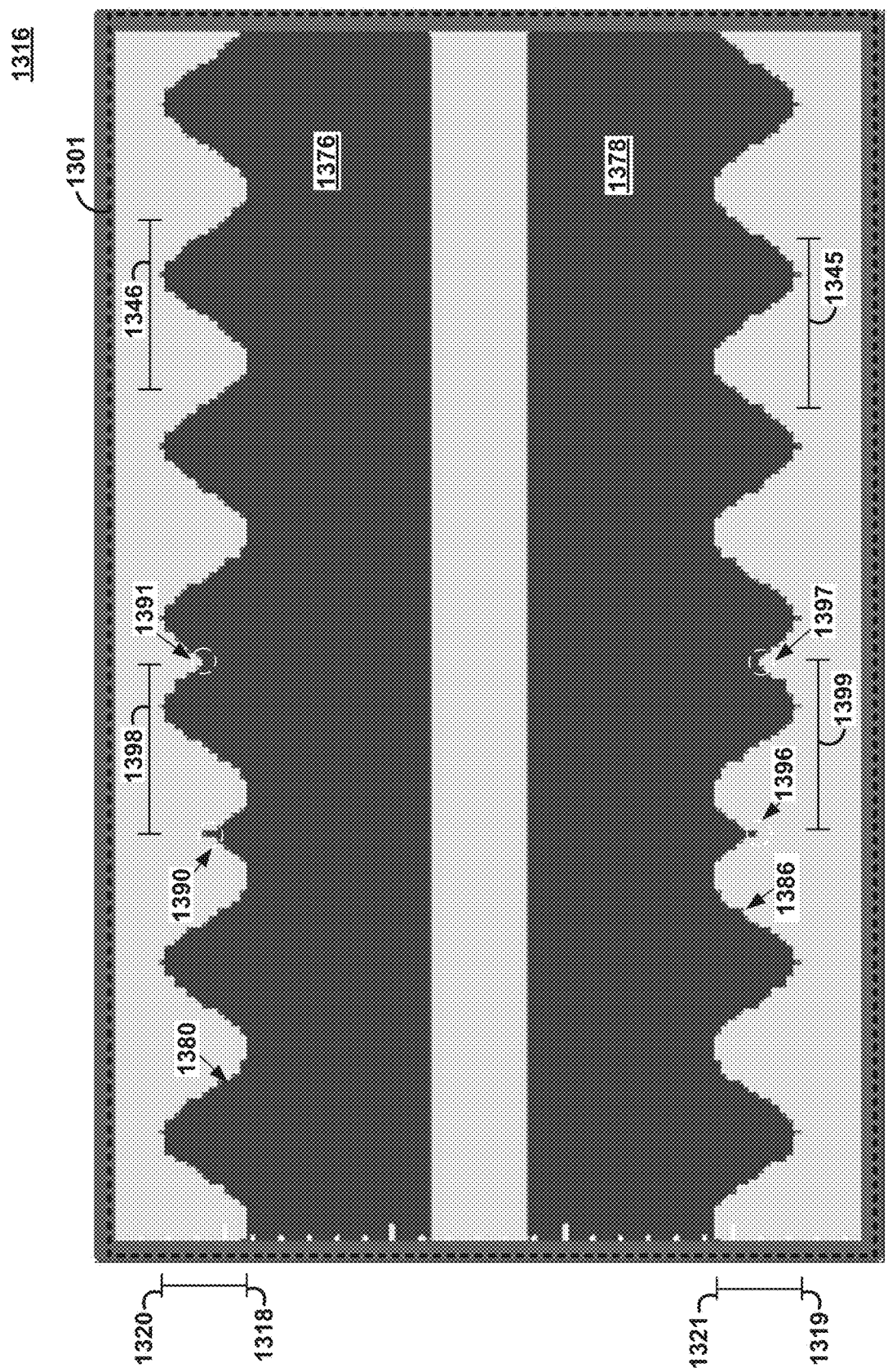
FIG. 13B is a conceptual diagram illustrating a second top view of the first example assembly of FIG. 13A, in accordance with one or more techniques of this disclosure.

FIG. 13A is a conceptual diagram illustrating a first top view of a first example assembly configured for two optical resonances, in accordance with one or more techniques of this disclosure. FIG. 13B is a conceptual diagram illustrating a second top view of the first example assembly of FIG. 13A, in accordance with one or more techniques of this disclosure. Assembly 1316 may be an example of assembly 616 of FIG. 6. The abscissa axis (e.g., horizontal axis) of FIG. 13B represents position of assembly 1316 along a first horizontal direction in microns and the ordinate axis (e.g., vertical axis) of FIG. 13B represents a position of assembly 1316 along a second horizontal direction in microns. FIGS. 13A, 13B are discussed with reference to FIGS. 1-12 for example purposes only.

As shown in FIGS. 13A, 13B, assembly 1316 may include beam structure 1376 and beam structure 1378. Beam structure 1376 and beam structure 1378 should not be interpreted as separate channels for an optical signal. The optical signal may co-propagate through assembly 1316 and can be expected to be delivered to the nanobeams by, for example, but not limited to, a "y-splitter" architecture. The y-splitter can take the optical signal and inject the optical signal into the dual-nanobeam optical channel with the appropriate spatial optical field distribution such that the dual-nanobeam optical channel can excite the resonances depicted in FIG. 20. The process may be reciprocal such the optical signal may continue to co-propagate away from the dual-nanobeam structure and out through the y-splitter architecture into the system shown in FIG. 6.

In the example of FIGS. 13A, 13B, outer sidewall 1380 of beam structure 1376 forms a sine wave having a first spatial frequency and outer sidewall 1386 of beam structure 1378 forms a sine wave having a second spatial frequency. In the example of FIGS. 13A, 13B, the first outer spatial frequency corresponds to (e.g., equals, matches, etc.) the second outer spatial frequency. However, in other examples, the first outer spatial frequency and the second outer spatial frequency may be different.

In the example of FIGS. 13A, 13B, outer sidewall 1380 of beam structure 1376 forms a continuous sine wave, however, in other examples, an outer sidewall may be discrete periodic. In the example of FIGS. 13A, 13B, outer sidewall 1380 of beam structure 1376 forms spatial features (e.g., a sine wave) that include periodic change in width, however, in other examples, an inner sidewall may include spatial features that include periodic change in only height or both width and height. In some examples, an outer sidewall may include spatial features that include periodic change in only height, only width, or both width and height.

As shown, outer sidewall 1380 includes first element 1390 that shifts the first spatial frequency of outer sidewall 1380 of assembly 1316 by approximately 180 degrees. More specifically, at first element 1390 of outer sidewall 1380 oscillates at a phase of the first spatial frequency that would increase the width of outer sidewall 1380 to maximum width 1320 of the first spatial frequency. However, first element 1390 shifts the spatial frequency by 180 such that outer sidewall 1380 oscillates at a phase of the spatial frequency decreases the width of outer sidewall 1380 to minimum width 1318 of the first spatial frequency.

Outer sidewall 1386 may include second element 1396 that shifts the second spatial frequency of assembly 1316 by approximately 180 degrees. More specifically, at second element 1396 of outer sidewall 1386 oscillates at a phase of the second spatial frequency that would increase the width of outer sidewall 1386 to maximum width 1321 of the second spatial frequency. However, second element 1396 shifts the spatial frequency by 180 such that outer sidewall 1386 oscillates at a phase of the spatial frequency decreases the width of outer sidewall 1386 to minimum width 1319 of the second spatial frequency.

First element 1390 may shift the first spatial frequency of assembly 1316 by approximately 180 degrees and second element 1396 of a second beam structure may shift the second spatial frequency of the proof mass assembly by approximately 180 degrees such that a first optical resonance is generated, which can be probed by a first optical signal output by sense laser 611 (and stabilized by intensity stabilizer 617) interacting with assembly 1316 and a second optical resonance is generated, which can be probed by a second optical signal output by drive laser 613 (and stabilized by intensity stabilizer 617) interacting with assembly 1316, wherein the first optical resonance and second optical resonance are spectrally separated by a minimum threshold. For example, the combination of first element 1390 and second element 1396 may shift the first optical signal and the second optical signal such that the first optical signal interacts with a blue resonance (e.g. 25 nm down-shifted from nominal resonance position ("$\lambda_0$") and the second optical signal interacts with a red resonance (e.g. 25 nm up-shifted from the nominal resonance position. In some examples, the combination of first element 1390 and second element 1396 may shift the first optical signal and the second optical signal such that the first optical signal interacts with a red resonance (e.g. 25 nm up-shifted from the nominal resonance position) and the second optical signal interacts with a blue resonance (e.g. 25 nm down-shifted from nominal resonance position).

Outer sidewall 1380 may include first corresponding element 1391 that shifts the first spatial frequency of outer sidewall 1380 of assembly 1316 by approximately 180 degrees. More specifically, at first corresponding element 1391 of outer sidewall 1380 oscillates at a phase of the first spatial frequency that would decrease the width of outer sidewall 1380 to minimum width 1318 of the first spatial frequency. However, first corresponding element 1391 shifts the spatial frequency by 180 such that outer sidewall 1380 oscillates at a phase of the spatial frequency increases the width of outer sidewall 1380 to maximum width 1320 of the first spatial frequency.

First corresponding element 1391 and first element 1390 may be positioned on a single sidewall of first beam structure 1376. In the example of FIGS. 13A, 13B, first corresponding element 1391 and first element 1390 are positioned on outer sidewall 1380. However, in other examples, first corresponding element 1391 and first element 1390 may be positioned on an inner sidewall of first beam structure 1376. In some examples, first corresponding element 1391 and first element 1390 may be positioned on different sidewalls of first beam structure 1376.

First corresponding element 1391 and first element 1390 may be spaced apart along a surface of first beam structure 1376 by a first distance 1398 that is less than or equal to cycle 1346 of the first spatial frequency. For example, first corresponding element 1391 and first element 1390 may be spaced apart along a surface of first beam structure 1376 by a first distance 1398 that corresponds to (e.g., is equal to) cycle 1346 of the first spatial frequency. However, in some examples, first corresponding element 1391 and first element 1390 be spaced apart along a surface of first beam structure 1376 by a distance less than one cycle 1346 of the first spatial frequency or greater than one cycle 1346 of the first spatial frequency. For instance, positioning first corresponding element 1391 and first element 1390 may be spaced apart along a surface of first beam structure 1376 by a distance that be less than one cycle 1346 of the first spatial frequency to further split optical field intensities for the driving optical signal and the sensing optical signal.

Outer sidewall 1386 may include second corresponding element 1397 that shifts the second spatial frequency of outer sidewall 1386 of assembly 1316 by approximately 180 degrees. More specifically, at second corresponding element 1397 of outer sidewall 1386 oscillates at a phase of the second spatial frequency that would decrease the width of outer sidewall 1386 to minimum width 1319 of the second spatial frequency. However, second corresponding element 1397 shifts the spatial frequency by 180 such that outer sidewall 1386 oscillates at a phase of the second spatial frequency increases the width of outer sidewall 1386 to maximum width 1321 of the second spatial frequency.

Second corresponding element 1397 and second element 1396 may be spaced apart along a surface of second beam structure 1378 by a second distance 1399 that is less than or equal to cycle 1345 of the second spatial frequency. For example, second corresponding element 1397 and second element 1396 may be spaced apart along a surface of second beam structure 1378 by a second distance 1399 that corresponds to (e.g., is equal to) cycle 1345 of the second spatial frequency. However, in some examples, second corresponding element 1397 and second element 1396 may be spaced apart along a surface of second beam structure 1378 by a distance less than one cycle 1345 of the second spatial frequency or greater than one cycle 1345 of the second spatial frequency. For instance, positioning second corresponding element 1397 and second element 1396 may be spaced apart along a surface of second beam structure 1378 by a distance that be less than one cycle 1345 of the second spatial frequency to further split optical field intensities for the driving optical signal and the sensing optical signal.

Second corresponding element 1397 and second element 1396 may be positioned on a single sidewall of second beam structure 1378. In the example of FIGS. 13A, 13B, second corresponding element 1397 and second element 1396 are positioned on outer sidewall 1386. However, in other examples, second corresponding element 1397 and second element 1396 may be positioned on an inner sidewall of second beam structure 1378. In some examples, second corresponding element 1397 and second element 1396 may be positioned on different sidewalls of first beam structure 1376.

First element 1390 may be positioned along a length of assembly 1316 corresponding to a position of second element 1396 along the length of assembly 1316. For example, as shown, first element 1390 may be positioned along a length of assembly 1316 that is equal to a position of second element 1396 along the length of assembly 1316. In some examples, first corresponding element 1391 is positioned along the length of assembly 1316 corresponding to a position of second corresponding element 1397 along the length of assembly 1316.

While the example of FIGS. 13A, 13B illustrates an element (e.g., first element 1390, second element 1396, etc.) and a corresponding element (e.g., first corresponding element 1391, second corresponding element 1397, etc.) as being positioned on outer sidewalls of a beam structure of an optomechanical device, in other examples, elements may be arranged on an inner sidewall of an optomechanical device. For example, an element and a corresponding element may be positioned on only inner sidewalls of an optomechanical device. In some examples, an inner element and a corresponding inner element may be positioned on inner sidewalls of an optomechanical device and an outer element and a corresponding outer element may be positioned on an outer sidewalls of the optomechanical device.

While the example of FIGS. 13A, 13B illustrates a set including an element (e.g., first element 1390, second element 1396, etc.) and a corresponding element (e.g., first corresponding element 1391, second corresponding element 1397, etc.) as being positioned on one sidewall of a beam structure of an optomechanical device, in other examples, an element may be positioned on one sidewall of the beam structure and a corresponding element may be positioned on the other sidewall of the beam structure. For example, a first element may be arranged on an inner sidewall of a first beam structure of an optomechanical device and a first corresponding element may be arranged on an outer sidewall of the first beam structure of the optomechanical device. In some examples, a first element may be arranged on an outer sidewall of a first beam structure of an optomechanical device and a first corresponding element may be arranged on an inner sidewall of the first beam structure.

Moreover, while the example of FIGS. 13A, 13B illustrate four elements, some examples may include fewer elements (e.g., 2 elements). For instance, element 1391 and element 1396 may be omitted, where element 1390 may represent a first element (or a second element) and element 1397 may represent a second element (or first element) that are offset by a lateral offset (e.g., along a surface of outer sidewall 1380 and/or outer sidewall 1386. In some instances, element 1390 and element 1397 may be omitted, where element 1391 may represent a first element (or a second element) and element 1396 may represent a second element (or a first element) that are offset by a lateral offset. Additionally, some examples may include additional elements (e.g., 6 elements, 8 elements, 10 elements, 12 elements, etc.).

Figure 14:
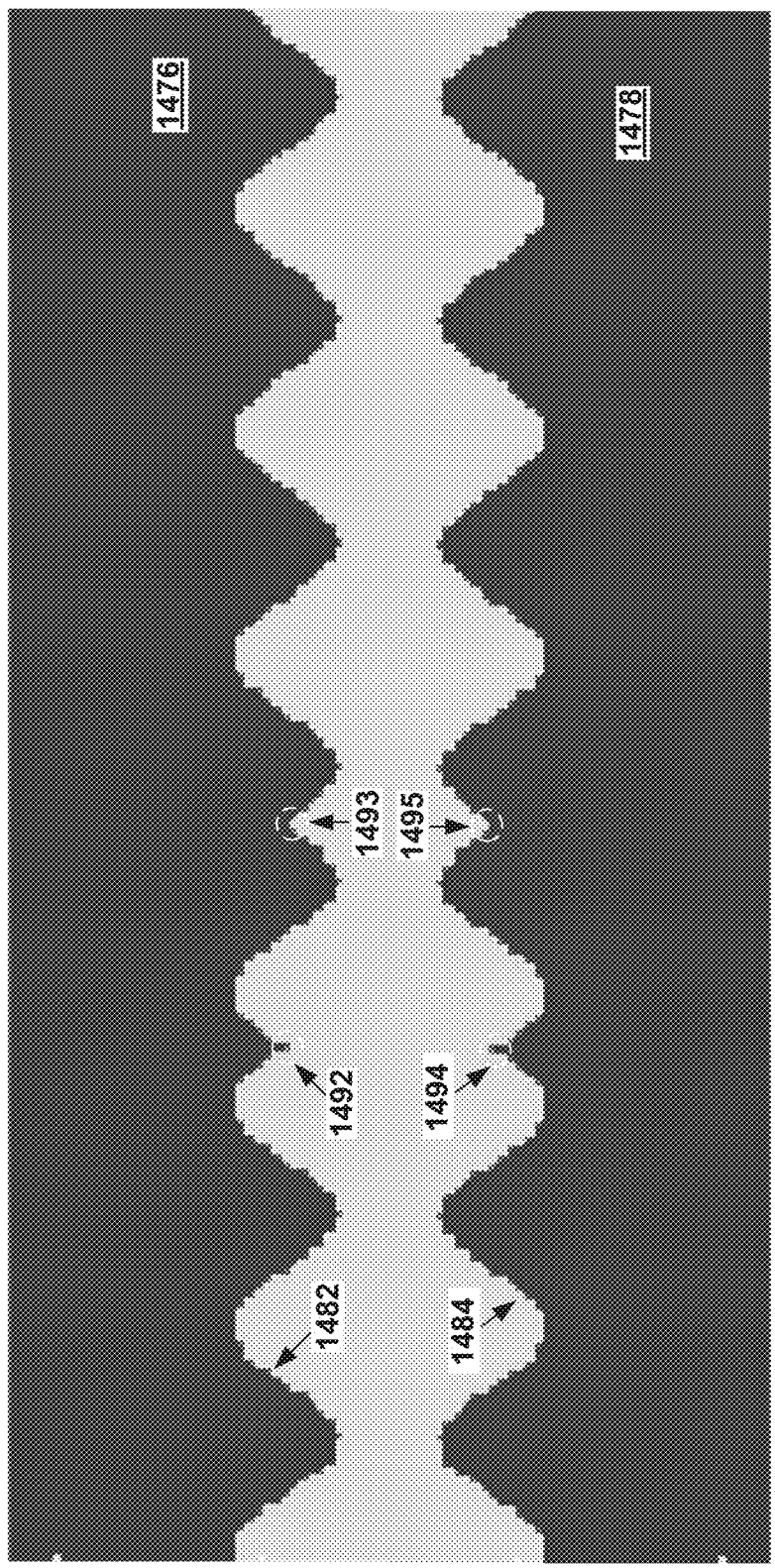
FIG. 14 is a conceptual diagram illustrating a second example assembly configured for two optical resonances, in accordance with one or more techniques of this disclosure.

FIG. 14 is a conceptual diagram illustrating a second example assembly configured for two optical resonances, in accordance with one or more techniques of this disclosure. Assembly 1416 may be an example of assembly 616 of FIG. 6. The abscissa axis (e.g., horizontal axis) of FIG. 14 represents position of assembly 1416 along a first horizontal direction in microns and the ordinate axis (e.g., vertical axis) of FIG. 14 represents a position of assembly 1416 along a second horizontal direction in microns. FIG. 14 is discussed with reference to FIGS. 1-12, 13A, 13B for example purposes only.

In the example of FIG. 14, inner sidewall 1482 of beam structure 1476 forms a sine wave having a first spatial frequency and inner sidewall 1484 of beam structure 1478 forms a sine wave having a second inner spatial frequency. In the example of FIG. 14, the first outer spatial frequency corresponds to (e.g., equals, matches, etc.) the second outer spatial frequency. However, in other examples, the first outer spatial frequency and the second outer spatial frequency may be different.

As shown, inner sidewall 1482 includes first element 1492 that shifts the first spatial frequency of inner sidewall 1482 of assembly 1416 by approximately 180 degrees. Inner sidewall 1484 may include second element 1494 that shifts the second spatial frequency of assembly 1416 by approximately 180 degrees. As shown, inner sidewall 1482 may include first corresponding element 1493 that shifts the first spatial frequency of inner sidewall 1482 by approximately 180 degrees. In some examples, inner sidewall 1484 may include second corresponding element 1495 that shifts the second spatial frequency of inner sidewall 1484 by approximately 180 degrees.

Figure 15:
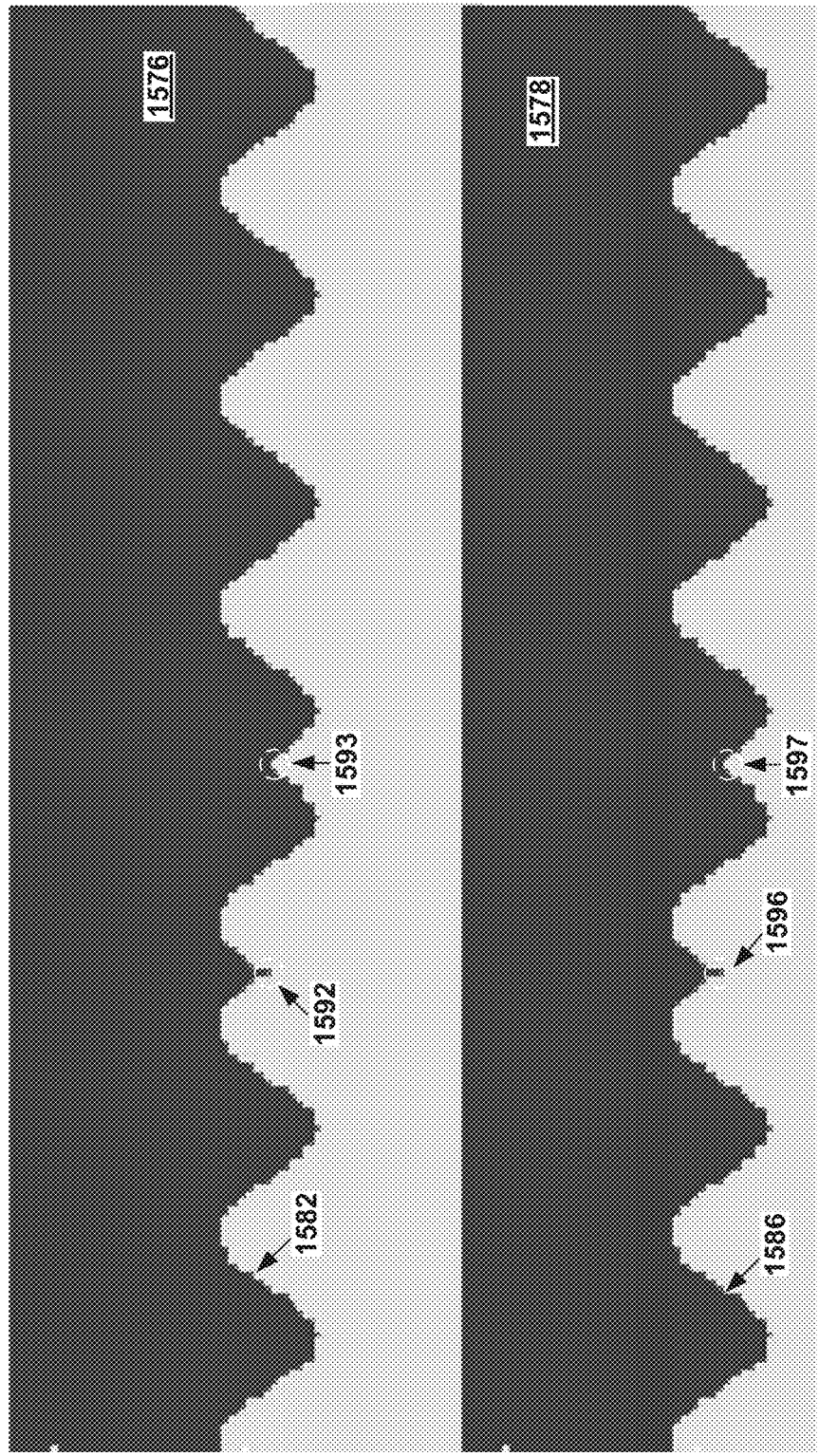
FIG. 15 is a conceptual diagram illustrating a third example assembly configured for two optical resonances, in accordance with one or more techniques of this disclosure.

FIG. 15 is a conceptual diagram illustrating a third example assembly configured for two optical resonances, in accordance with one or more techniques of this disclosure. Assembly 1516 may be an example of assembly 616 of FIG. 6. The abscissa axis (e.g., horizontal axis) of FIG. 15 represents position of assembly 1516 along a first horizontal direction in microns and the ordinate axis (e.g., vertical axis) of FIG. 15 represents a position of assembly 1516 along a second horizontal direction in microns. FIG. 15 is discussed with reference to FIGS. 1-12, 13A, 13B, 14 for example purposes only.

In the example of FIG. 15, inner sidewall 1582 of beam structure 1576 forms a sine wave having a first spatial frequency and outer sidewall 1586 of beam structure 1578 forms a sine wave having a second inner spatial frequency. In the example of FIG. 15, the first outer spatial frequency corresponds to (e.g., equals, matches, etc.) the second outer spatial frequency. However, in other examples, the first outer spatial frequency and the second outer spatial frequency may be different.

As shown, inner sidewall 1582 includes first element 1592 that shifts the first spatial frequency of inner sidewall 1582 by approximately 180 degrees. Outer sidewall 1586 may include second element 1596 that shifts the second spatial frequency by approximately 180 degrees. As shown, inner sidewall 1582 may include first corresponding element 1593 that shifts the first spatial frequency of inner sidewall 1582 by approximately 180 degrees. In some examples, outer sidewall 1586 may include second corresponding element 1597 that shifts the second spatial frequency of outer sidewall 1586 by approximately 180 degrees.

Figure 16:
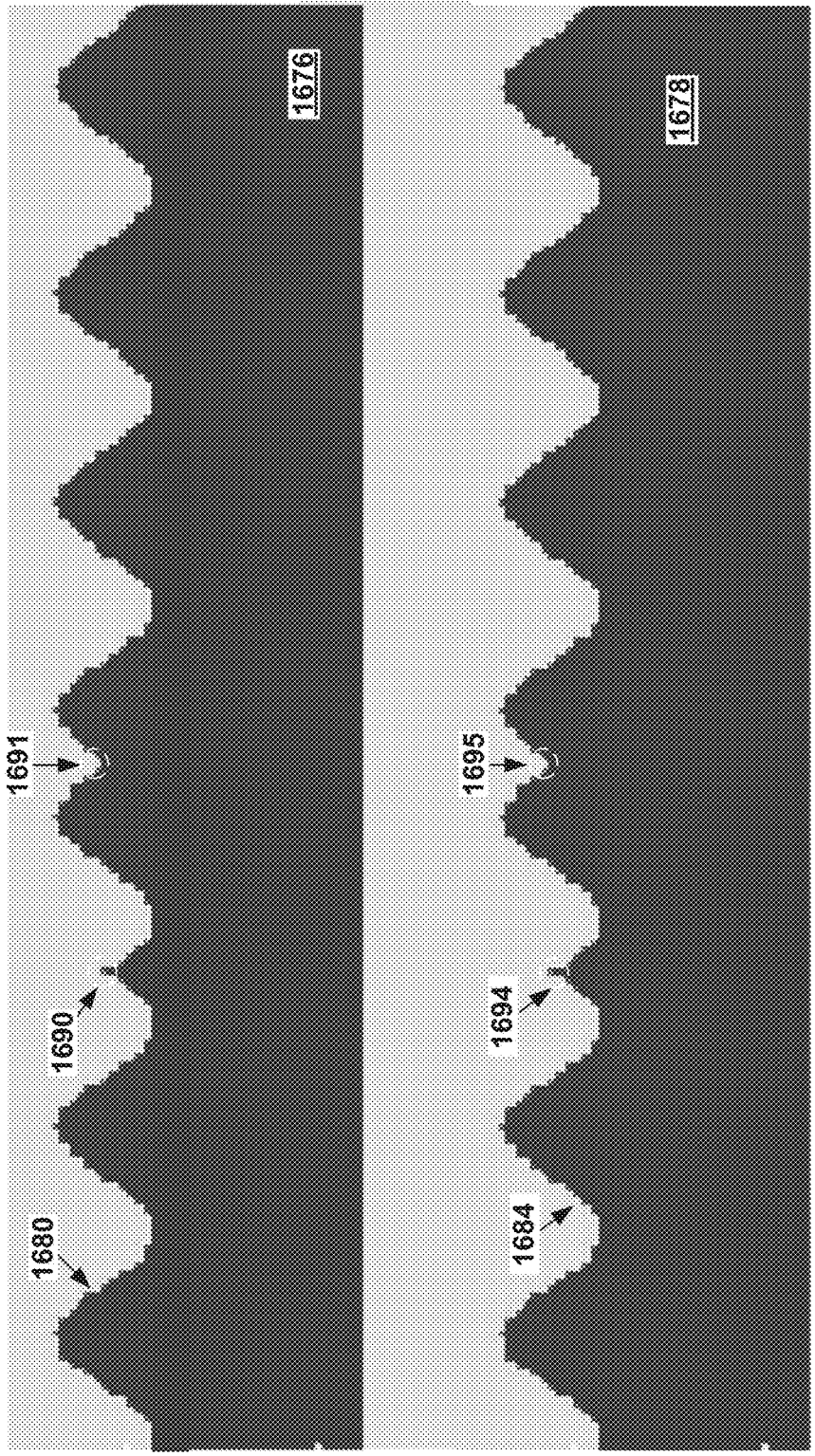
FIG. 16 is a conceptual diagram illustrating a fourth example assembly configured for two optical resonances, in accordance with one or more techniques of this disclosure.

FIG. 16 is a conceptual diagram illustrating a fourth example assembly configured for two optical resonances, in accordance with one or more techniques of this disclosure. Assembly 1616 may be an example of assembly 616 of FIG. 6. The abscissa axis (e.g., horizontal axis) of FIG. 16 represents position of assembly 1616 along a first horizontal direction in microns and the ordinate axis (e.g., vertical axis) of FIG. 16 represents a position of assembly 1616 along a second horizontal direction in microns. FIG. 16 is discussed with reference to FIGS. 1-12, 13A, 13B, 14, 15 for example purposes only.

In the example of FIG. 16, outer sidewall 1680 of beam structure 1676 forms a sine wave having a first spatial frequency and inner sidewall 1684 of beam structure 1678 forms a sine wave having a second inner spatial frequency. In the example of FIG. 16, the first outer spatial frequency corresponds to (e.g., equals, matches, etc.) the second outer spatial frequency. However, in other examples, the first outer spatial frequency and the second outer spatial frequency may be different.

As shown, outer sidewall 1680 includes first element 1690 that shifts the first spatial frequency of outer sidewall 1680 by approximately 180 degrees. Inner sidewall 1684 may include second element 1694 that shifts the second spatial frequency by approximately 180 degrees. As shown, outer sidewall 1680 may include first corresponding element 1691 that shifts the first spatial frequency of outer sidewall 1680 by approximately 180 degrees. In some examples, inner sidewall 1684 may include second corresponding element 1695 that shifts the second spatial frequency of inner sidewall 1684 by approximately 180 degrees.

Figure 17:
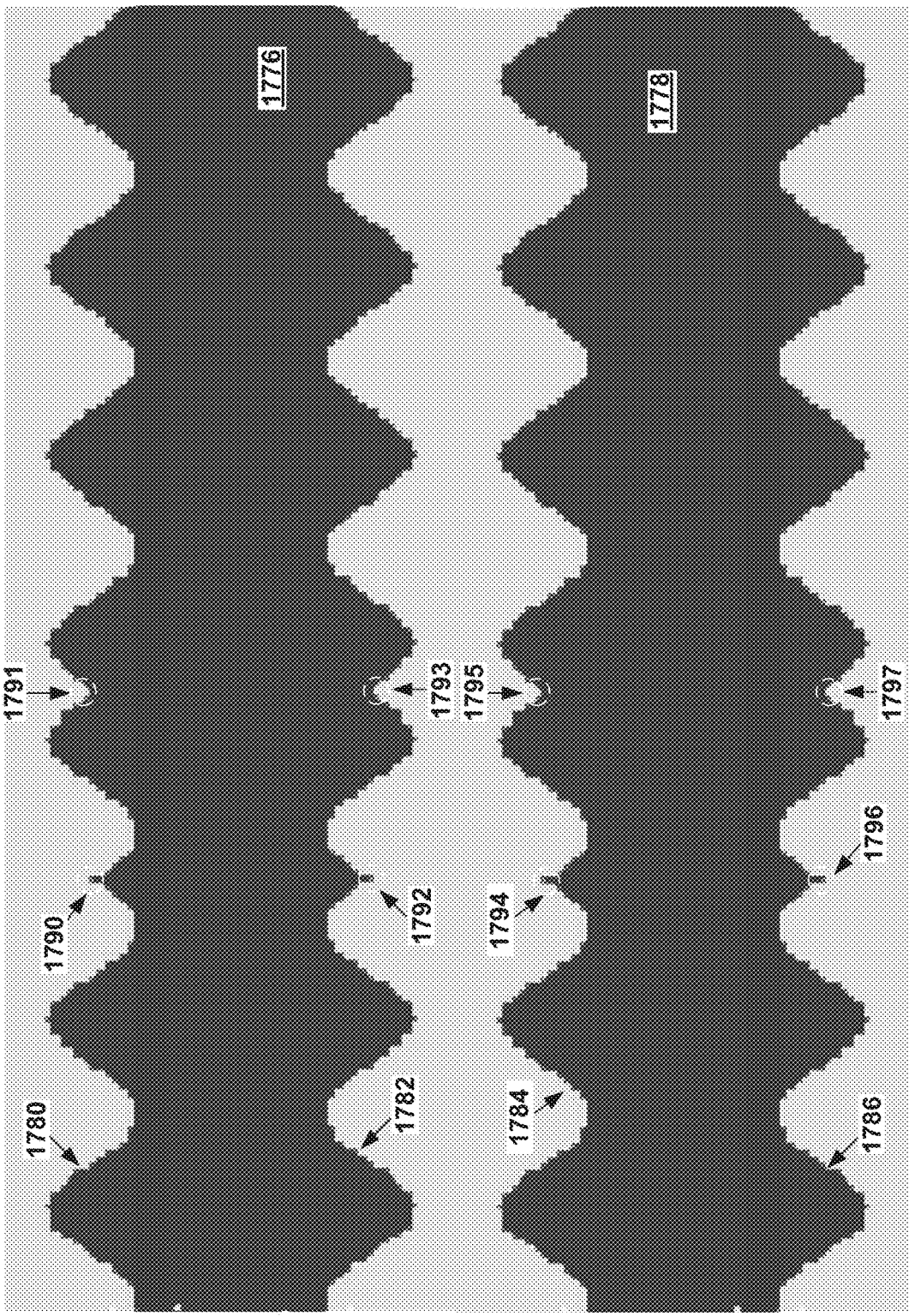
FIG. 17 is a conceptual diagram illustrating a fifth example assembly configured for two optical resonances, in accordance with one or more techniques of this disclosure.

FIG. 17 is a conceptual diagram illustrating a fifth example assembly configured for two optical resonances, in accordance with one or more techniques of this disclosure. Assembly 1716 may be an example of assembly 616 of FIG. 6. The abscissa axis (e.g., horizontal axis) of FIG. 17 represents position of assembly 1716 along a first horizontal direction in microns and the ordinate axis (e.g., vertical axis) of FIG. 17 represents a position of assembly 1716 along a second horizontal direction in microns. FIG. 17 is discussed with reference to FIGS. 1-12, 13A, 13B, 14-16 for example purposes only.

In the example of FIG. 17, outer sidewall 1780 of beam structure 1776 forms a sine wave having a first outer spatial frequency and inner sidewall 1782 of beam structure 1776 forms a sine wave having a first inner spatial frequency. Additionally, in this example, inner sidewall 1784 of beam structure 1778 forms a sine wave having a second inner spatial frequency and outer sidewall 1786 of beam structure 1778 forms a sine wave having a second outer spatial frequency. In the example of FIG. 17, the first outer spatial frequency corresponds to (e.g., equals, matches, etc.) the second outer spatial frequency and the first inner spatial frequency corresponds to the second inner spatial frequency. However, in other examples, one or more of the first outer spatial frequency, the first inner spatial frequency, the second outer spatial frequency, and the second inner spatial frequency may be different.

As shown, outer sidewall 1780 may include first outer element 1790 that shifts the first outer spatial frequency of outer sidewall 1780 by approximately 180 degrees and/or first corresponding outer element 1790 that shifts the first outer spatial frequency of outer sidewall 1780 by approximately 180 degrees. Inner sidewall 1782 may include first inner element 1792 that shifts the first inner spatial frequency of inner sidewall 1782 by approximately 180 degrees and/or first corresponding inner element 1793 that shifts the first inner spatial frequency of inner sidewall 1782 by approximately 180 degrees.

In some examples, inner sidewall 1784 may include second inner element 1794 that shifts the second inner spatial frequency of inner sidewall 1784 by approximately 180 degrees and/or second corresponding inner element 1795 that shifts the second inner spatial frequency of inner sidewall 1784 by approximately 180 degrees. Outer sidewall 1786 may include second outer element 1796 that shifts the second outer spatial frequency of outer sidewall 1786 by approximately 180 degrees and/or second corresponding outer element 1797 that shifts the second outer spatial frequency of outer sidewall 1786 by approximately 180 degrees.

Figure 18:
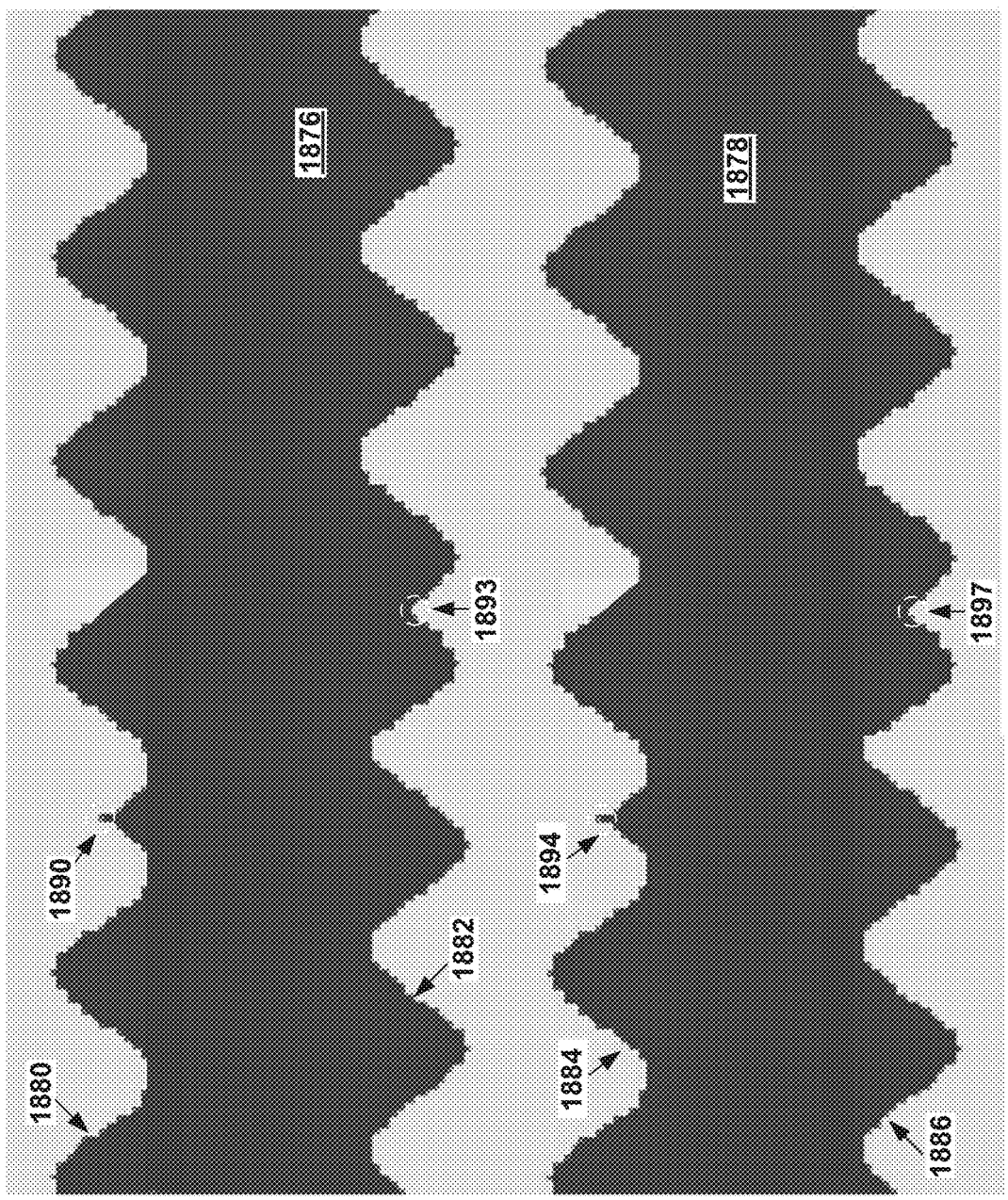
FIG. 18 is a conceptual diagram illustrating a sixth example assembly configured for two optical resonances, in accordance with one or more techniques of this disclosure.

FIG. 18 is a conceptual diagram illustrating a sixth example assembly configured for two optical resonances, in accordance with one or more techniques of this disclosure. Assembly 1816 may be an example of assembly 616 of FIG. 6. The abscissa axis (e.g., horizontal axis) of FIG. 18 represents position of assembly 1816 along a first horizontal direction in microns and the ordinate axis (e.g., vertical axis) of FIG. 18 represents a position of assembly 1816 along a second horizontal direction in microns. FIG. 18 is discussed with reference to FIGS. 1-12, 13A, 13B, 14, 15, 16, 17 for example purposes only.

In the example of FIG. 18, outer sidewall 1880 of beam structure 1876 forms a sine wave having a first outer spatial frequency and inner sidewall 1882 of beam structure 18876 forms a sine wave having a first inner spatial frequency. Additionally, in this example, inner sidewall 1884 of beam structure 1878 forms a sine wave having a second inner spatial frequency and outer sidewall 1886 of beam structure 1878 forms a sine wave having a second outer spatial frequency. In the example of FIG. 18, the first outer spatial frequency corresponds to (e.g., equals, matches, etc.) the second outer spatial frequency and the first inner spatial frequency corresponds to the second inner spatial frequency. However, in other examples, one or more of the first outer spatial frequency, the first inner spatial frequency, the second outer spatial frequency, and the second inner spatial frequency may be different.

As shown, outer sidewall 1880 may include first outer element 1890 that shifts the first outer spatial frequency of outer sidewall 1880 by approximately 180 degrees and/or first corresponding inner element 1893 that shifts the first outer spatial frequency of outer sidewall 1882 by approximately 180 degrees. In some examples, inner sidewall 1884 may include second inner element 1894 that shifts the second inner spatial frequency of inner sidewall 1884 by approximately 180 degrees and/or second corresponding outer element 1897 that shifts the second outer spatial frequency of outer sidewall 1886 by approximately 180 degrees.

Figure 19:
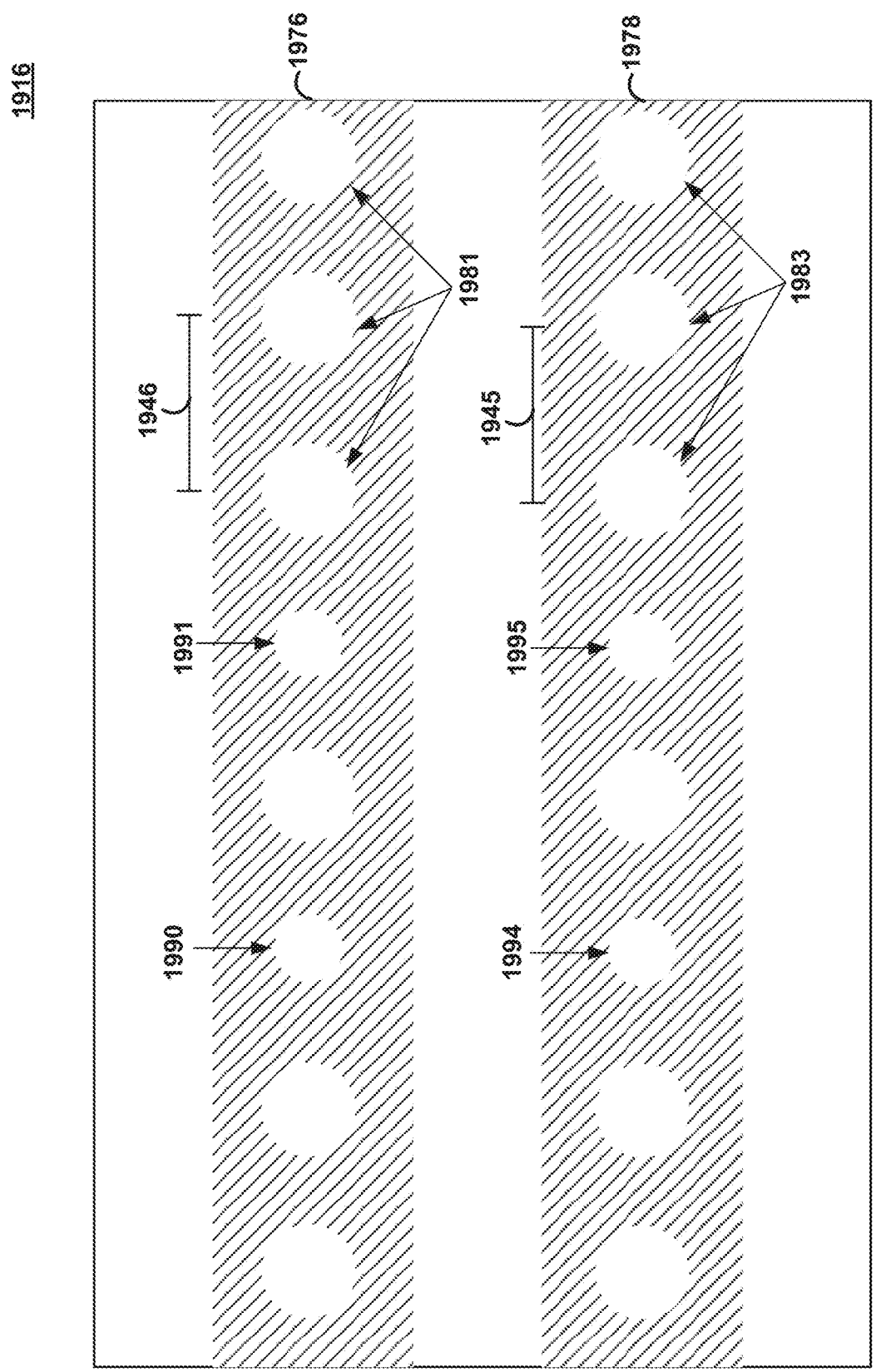
FIG. 19 is a conceptual diagram illustrating a seventh example assembly configured for two optical resonances, in accordance with one or more techniques of this disclosure.

FIG. 19 is a conceptual diagram illustrating a seventh example assembly configured for two optical resonances, in accordance with one or more techniques of this disclosure. Assembly 1916 may be an example of assembly 616 of FIG. 6. The abscissa axis (e.g., horizontal axis) of FIG. 19 represents position of assembly 1916 along a first horizontal direction in microns and the ordinate axis (e.g., vertical axis) of FIG. 19 represents a position of assembly 1916 along a second horizontal direction in microns. FIG. 19 is discussed with reference to FIGS. 1-12, 13A, 13B, 14-18 for example purposes only. As shown in FIG. 19, assembly 1916 may include first beam structure 1976 and second beam structure 1978. First beam structure 1976 and second beam structure 1978 should not be interpreted as separate channels for an optical signal.

In the example of FIG. 19, first beam structure 1976 may comprise a periodic series of indentations that may include first plurality of indentations 1981, first perturbed indentation 1990, and first corresponding perturbed indentation 1991. As used herein, an indentation may refer to a hole extending through a beam structure or a cavity extending only partially through a beam structure. First beam structure 1976 may comprise a first spatial frequency based on spacing 1946, which extends between a center of adjacent indentations of first plurality of indentations 1981. Second beam structure 1978 may comprise a periodic series of indentations that may include second plurality of indentations 1983, second perturbed indentation 1994, and second corresponding perturbed indentation 1995. Second beam structure 1978 may comprise a second spatial frequency based on spacing 1945, which extends between a center of adjacent indentations of second plurality of indentations 1983. In the example of FIG. 19, the first spatial frequency corresponds to (e.g., equals, matches, etc.) the second spatial frequency. For example, spacing 1946 is equal to spacing 1945. However, in other examples, the first spatial frequency and the second spatial frequency may be different.

First perturbed indentation 1990 may shift the first spatial frequency and second perturbed indentation 1994 may shift the second spatial frequency such that a first optical resonance and a second optical resonance are generated and spectrally separated by a minimum threshold, such that the first optical resonance is probed by the first optical signal interacting with the assembly and the second optical resonance is probed by the second optical signal interacting with the assembly. Similar, first corresponding perturbed indentation 1991 may shift the first spatial frequency and second corresponding perturbed indentation 1995 may shift the second spatial frequency such that a first optical resonance and a second optical resonance are generated and spectrally separated by a minimum threshold, such that the first optical resonance is probed by the first optical signal interacting with the assembly and the second optical resonance is probed by the second optical signal interacting with the assembly. In some examples, the minimum threshold may be greater than a ratio (e.g., between 1/100 to 1/1000) times a nominal optical resonance of assembly 1916. For instance, the minimum threshold may be greater than 1/100 times 1550 nm or 15.5 nm, greater than 1/1000 times 1550 nm or 1.55 nm, or greater than a value within the range of 1.55 nm and 15.5 nm. In some examples, the minimum threshold may be greater than 1 nm, 2 nm, 10 nm, 100 nm, or another value.

First perturbed indentation 1990 and/or first corresponding perturbed indentation 1991 may have a different size (e.g., smaller or larger) than other indentations of first beam structure 1976. In some examples, first perturbed indentation 1990 and/or first corresponding perturbed indentation 1991 may have a different shape (e.g., square, polygon, rectangular, oval, etc.) than other indentations of first beam structure 1976. In some examples, first perturbed indentation 1990 and/or first corresponding perturbed indentation 1991 may be positioned within first beam structure 1976 and from an adjacent indentation of first beam structure 1976 with a spacing that is less than spacing 1946. In some examples, first perturbed indentation 1990 and/or first corresponding perturbed indentation 1991 may be vertically positioned within first beam structure 1976 (e.g., higher or lower) differently than other indentations of first beam structure 1976.

Similarly, second perturbed indentation 1994 and/or second corresponding perturbed indentation 1995 may have a different size (e.g., smaller or larger) than other indentations of second beam structure 1978. In some examples, second perturbed indentation 1994 and/or second corresponding perturbed indentation 1995 may have a different shape (e.g., square, polygon, rectangular, oval, etc.) than other indentations of second beam structure 1978. In some examples, second perturbed indentation 1994 and/or second corresponding perturbed indentation 1995 may be positioned within second beam structure 1978 from an adjacent indentation of second beam structure 1978 and with a spacing that is less than spacing 1945. In some examples, second perturbed indentation 1994 and/or second corresponding perturbed indentation 1995 may be vertically positioned within second beam structure 1978 (e.g., higher or lower) differently than other indentations of second beam structure 1978.

Figure 20:
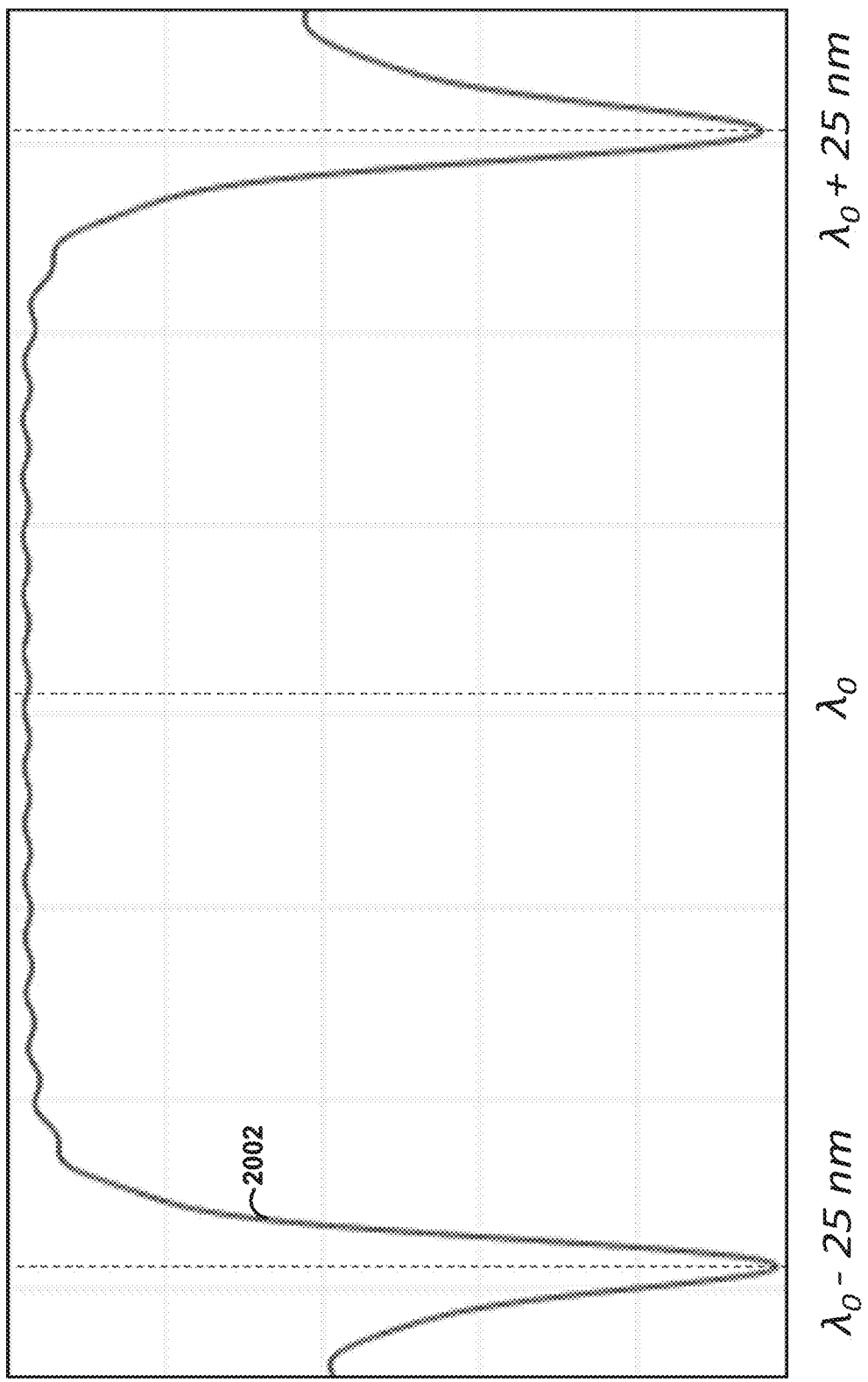
FIG. 20 is a conceptual diagram of an example optical reflectance versus wavelength, in accordance with one or more techniques of this disclosure.

FIG. 20 is a conceptual diagram of an example optical reflectance versus wavelength, in accordance with one or more techniques of this disclosure. The abscissa axis (e.g., horizontal axis) of FIG. 20 represents a device reflectance of assembly 616 and the ordinate axis (e.g., vertical axis) of FIG. 19 represents an optical wavelength 2002 of an optical signal received by assembly 616. FIG. 20 is discussed with reference to FIGS. 1-12, 13A, 13B, 14-19 for example purposes only.

In the example of FIG. 20, to operate, the intensity-stabilized drive laser (e.g., drive laser 613) is set to interact with a blue resonance (e.g. 25 nm down-shifted from nominal resonance position ("$\lambda_0$") in FIG. 20), while the intensity-stabilized sense laser (e.g., sense laser 611) is set to interact with the red resonance (e.g. 25 nm up-shifted from nominal resonance position in FIG. 20). In this example, the overall system architecture/hardware matches system 600. However, in other examples, other systems may be used. As shown, optical wavelength 2002 includes a spectral separation that is nearly 50 nm in terms of wavelength, which may provide sufficient spacing to utilize commercial off-the-shelf (COTS) dichroic filters. That is, a first element and a second element (and first corresponding element and second corresponding element) may result in the generation of a first optical resonance, which is probed by a first optical signal (e.g., a sensing optical signal), and the generation of a second optical resonance, which is probed by the second optical signal (e.g., a driving optical signal), where the first optical resonance and the second resonance are spectrally separated by a minimum threshold of nearly 50 nm. In some examples, the minimum threshold may be greater than 1/100 times a nominal resonance of the proof mass assembly. For instance, the minimum threshold may be greater than 1/100 times 1550 nm or 15.5 nm. In some examples, the minimum threshold may be greater than 10 nm.

Figure 21:
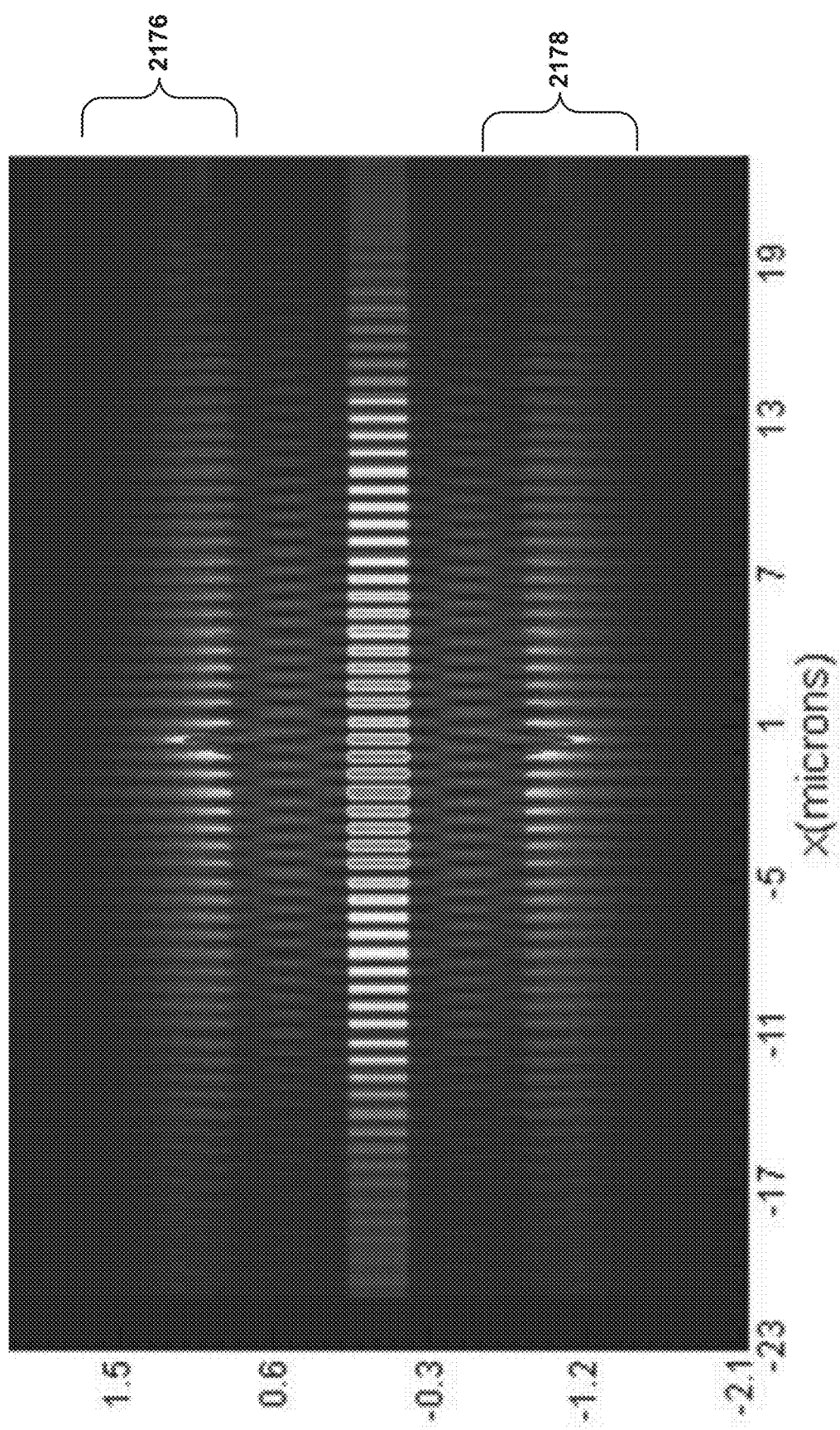
FIG. 21 is a conceptual diagram illustrating an example top-view, optical intensity distribution of an optical signal down-shifted from the nominal resonance position of FIG. 20, in accordance with one or more techniques of this disclosure.

FIG. 21 is a conceptual diagram illustrating an example top-view, optical intensity distribution of an optical signal down-shifted from the nominal resonance position of FIG. 20, in accordance with one or more techniques of this disclosure. The abscissa axis (e.g., horizontal axis) of FIG. 21 represents position of an assembly (e.g., proof mass assembly) along a first horizontal direction in microns and the ordinate axis (e.g., vertical axis) of FIG. 21 represents a position of the assembly along a second horizontal direction in microns. FIG. 21 is discussed with reference to FIGS. 1-12, 13A, 13B, 14-20 for example purposes only. As shown, the optical resonance is focused between a first beam structure 2176 of the assembly and a second beam structure 2178 of the assembly. While FIG. 21 is discussed separately from FIG. 22, it should be understood that the optical resonance for the optical signal down-shifted from the nominal resonance illustrated in FIG. 21 may co-propagate with the optical resonance for the optical signal up-shifted from the nominal resonance illustrated in FIG. 22 within a single assembly.

Figure 22:
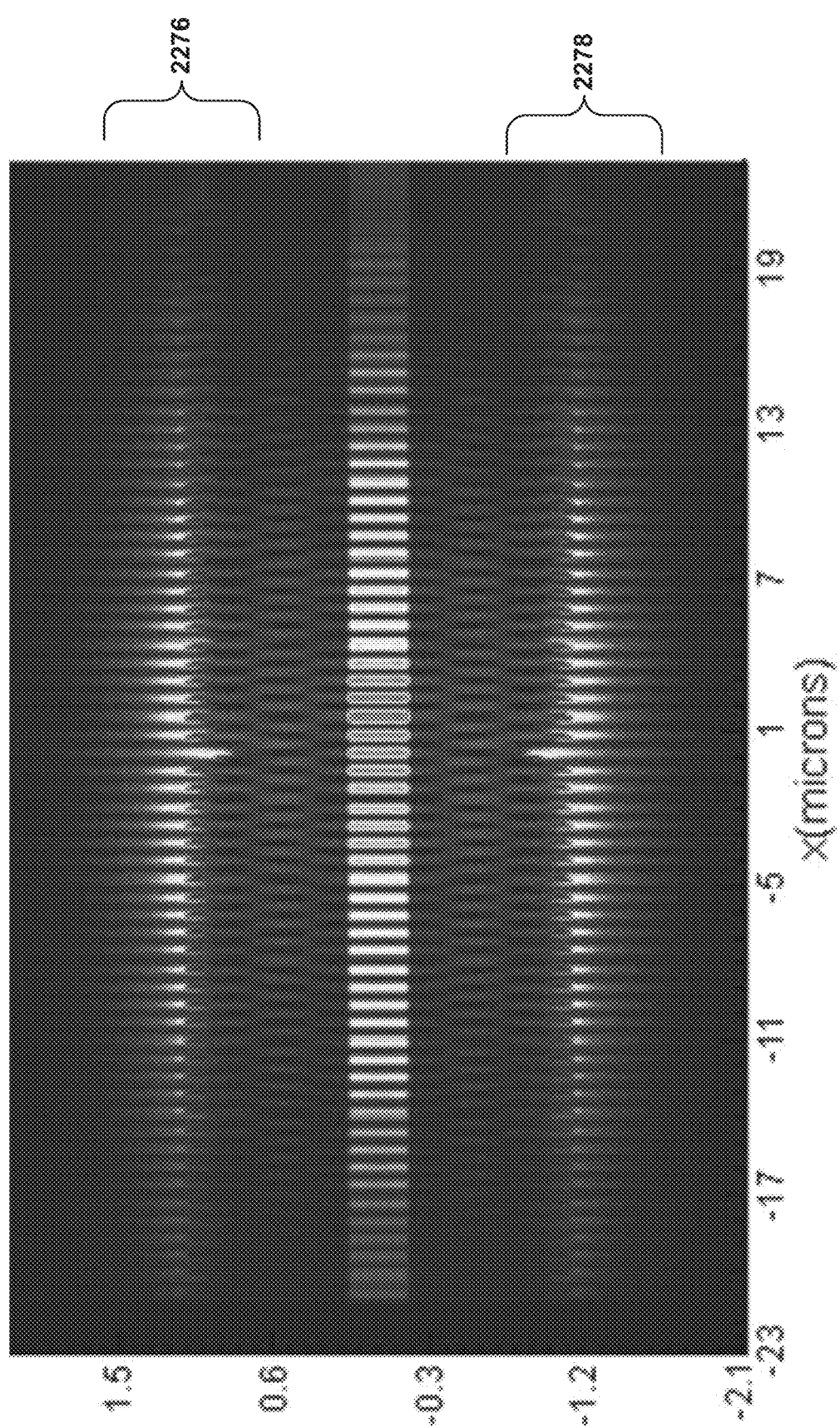
FIG. 22 is a conceptual diagram illustrating an example top-view, optical intensity distribution of an optical signal up-shifted from the nominal resonance position of FIG. 20, in accordance with one or more techniques of this disclosure.

FIG. 22 is a conceptual diagram illustrating an example top-view, optical intensity distribution of an optical signal up-shifted from the nominal resonance position of FIG. 20, in accordance with one or more techniques of this disclosure. The abscissa axis (e.g., horizontal axis) of FIG. 22 represents position of an assembly (e.g., proof mass assembly) along a first horizontal direction in microns and the ordinate axis (e.g., vertical axis) of FIG. 22 represents a position of the assembly along a second horizontal direction in microns. FIG. 22 is discussed with reference to FIGS. 1-12, 13A, 13B, 14-21 for example purposes only. As shown, the optical resonance is focused between a first beam structure 2276 of the assembly and a second beam structure 2278 of the assembly. While FIG. 22 is discussed separately from FIG. 21, it should be understood that the optical resonance for the optical signal down-shifted from the nominal resonance illustrated in FIG. 21 may co-propagate with the optical resonance for the optical signal up-shifted from the nominal resonance illustrated in FIG. 22 within a single assembly.

As shown in FIGS. 21, 22, the optical resonance for the optical signal down-shifted from the nominal resonance illustrated in FIG. 21 and the optical resonance for the optical signal up-shifted from the nominal resonance illustrated in FIG. 22 overlap such that an optical signal down-shifted from the nominal resonance may exhibit common-mode behavior with an optical signal up-shifted from the nominal resonance.

The optomechanical device described herein may include only analog circuitry, only digital circuitry, or a combination of analog circuitry and digital circuitry. Digital circuitry may include, for example, a microcontroller on a single integrated circuit containing a processor core, memory, inputs, and outputs. For example, digital circuitry of the optomechanical device described herein may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing analog circuitry and/or digital circuitry, alone or in combination with other logic circuitry, or any other equivalent circuitry.

The techniques of this disclosure may be implemented in a wide variety of devices or apparatuses that include integrated circuits (ICs) or sets of ICs (e.g., chip sets). Various components, modules, or units are described in this disclosure to emphasize functional aspects of devices configured to perform the disclosed techniques, but do not necessarily require realization by different hardware units. Rather, various units may be combined or provided by a collection of interoperative hardware units, including one or more processors as described above, in conjunction with suitable software and/or firmware.

What is claimed is:

1. An optomechanical device for producing and detecting optical signals, the optomechanical device comprising:
    an assembly, wherein the assembly comprises a first beam structure comprising a first spatial frequency and a second beam structure comprising a second spatial frequency;
    one or more laser devices configured to generate a first optical signal and a second optical signal, wherein the first optical signal comprises a frequency different than a frequency of the second optical signal; and
    circuitry configured to:
        modulate, with an electro-optic modulator (EOM), the second optical signal;
        output the first optical signal and the second optical signal to the assembly, wherein a first element of the first beam structure shifts the first spatial frequency of the assembly by approximately 180 degrees and a second element of the second beam structure shifts the second spatial frequency of the assembly by approximately 180 degrees such that a first optical resonance is generated, which is probed by the first optical signal interacting with the assembly, and a second optical resonance is generated, which is probed by the second optical signal interacting with the assembly, and wherein the first optical resonance and the second optical resonance are spectrally separated by a minimum threshold;
        generate a filtered optical signal corresponding to a response by the assembly to the first optical signal without the second optical signal; and
        generate an electrical signal based on the filtered optical signal, wherein the EOM modulates the second optical signal based on the electrical signal.

2. The optomechanical device of claim 1, wherein the circuitry is configured to:
    generate an indication of an acceleration at the assembly based on the electrical signal.

3. The optomechanical device of claim 1,
    wherein a first sidewall of the first beam structure forms a sine wave comprising the first spatial frequency and wherein a second sidewall of the second beam structure forms a sine wave comprising the second spatial frequency.

4. The optomechanical device of claim 3,
    wherein the first sidewall forms an inner sidewall of the first beam structure and the second sidewall forms an inner sidewall of the second beam structure;
    wherein the first sidewall forms an inner sidewall of the first beam structure and the second sidewall forms an outer sidewall of the second beam structure;
    wherein the first sidewall forms an outer sidewall of the first beam structure and the second sidewall forms an inner sidewall of the second beam structure; or
    wherein the first sidewall forms an outer sidewall of the first beam structure and the second sidewall forms an outer sidewall of the second beam structure.

5. The optomechanical device of claim 1,
    wherein a first corresponding element of the first beam structure shifts the first spatial frequency of the optomechanical accelerometer by approximately 180 degrees; and
    wherein a second corresponding element of the second beam structure shifts the second spatial frequency of the optomechanical accelerometer by approximately 180 degrees.

6. The optomechanical device of claim 5,
    wherein the first corresponding element and the first element are spaced apart along a surface of the first beam structure by a first distance that is less than or equal to a cycle of the first spatial frequency; and
    wherein the second corresponding element and the second element are spaced apart along a surface of the second beam structure by a second distance less than or equal to a cycle of the second spatial frequency.

7. The optomechanical device of claim 6, wherein the first distance corresponds to the second distance.

8. The optomechanical device of claim 5,
    wherein the first element is positioned along a length of the assembly corresponding to a position of the second element along the length of the assembly; and
    wherein the first corresponding element is positioned along the length of the assembly corresponding to a position of the second corresponding element along the length of the assembly.

9. The optomechanical device of claim 5,
    wherein the first element is positioned at a first initial phase of the first spatial frequency that would increase a width of a first sidewall of the first beam structure and the first element shifts the first initial phase of the first spatial frequency by approximately 180 degrees such that the width of the first sidewall decreases at the first element; and
    wherein the first corresponding element is positioned at a first corresponding initial phase of the first spatial frequency that would decrease a width of the first sidewall and the first corresponding element shifts the first corresponding initial phase of the first spatial frequency by approximately 180 degrees such that the width of the first sidewall increases at the first element.

10. The optomechanical device of claim 5,
    wherein the first element is positioned at a first initial phase of the first spatial frequency that would decrease a width of a first sidewall of the first beam structure and the first element shifts the first initial phase of the first spatial frequency by approximately 180 degrees such that the width of the first sidewall increases at the first element; and
    wherein the first corresponding element is positioned at a first corresponding initial phase of the first spatial frequency that would increase a width of the first sidewall and the first corresponding element shifts the first corresponding initial phase of the first spatial frequency by approximately 180 degrees such that the width of the first sidewall decreases at the first element.

11. The optomechanical device of claim 5,
wherein the first element is positioned on a first sidewall of the first beam structure and wherein the first corresponding element is positioned on the first sidewall; or
wherein the first element is positioned on a first sidewall of the first beam structure, wherein the first beam structure comprises an opposing sidewall arranged on an opposite side of the first beam structure from the first sidewall and wherein the first corresponding element is positioned on the opposing sidewall.

12. The optomechanical device of claim 5,
wherein a third element of a first beam structure shifts the first spatial frequency of the assembly by approximately 180 degrees and wherein a third corresponding element of a first beam structure shifts the first spatial frequency of the assembly by approximately 180 degrees; and
wherein a fourth element of a second beam structure shifts the second spatial frequency of the assembly by approximately 180 degrees and wherein a fourth corresponding element of a second beam structure shifts the second spatial frequency of the assembly by approximately 180 degrees.

13. The optomechanical device of claim 1, wherein the minimum threshold is greater than a ratio between 1/100 and 1/1000 times a nominal optical resonance of the assembly.

14. The optomechanical device of claim 1, wherein the minimum threshold is greater than 10 nanometers.

15. The optomechanical device of claim 1, wherein the circuitry comprises an optical circulator, wherein, to output the first optical signal and the second optical signal to the assembly, the circuitry circuit is configured to:
combine the first optical signal and second optical signal into a combined optical signal;
output the combined optical signal to the optical circulator, wherein the optical circulator outputs the combined optical signal to the assembly and receives a response from the assembly to the first optical signal and the second optical signal.

16. The optomechanical device of claim 15, wherein the circuitry comprises a filter configured to:
generate the filtered optical signal corresponding to the response by the assembly to the first optical signal without the second optical signal using the response from the assembly to the first optical signal and the second optical signal.

17. The optomechanical device of claim 16, wherein the filter comprises a dichroic filter.

18. A method for producing and detecting optical signals, the method comprising:
generating, by one or more laser devices, a first optical signal and a second optical signal, wherein the first optical signal comprises a frequency different than a frequency of the second optical signal;
modulating, by an electro-optic modulator (EOM) of circuitry, the second optical signal;
outputting, by the circuitry, the first optical signal and the second optical signal to an assembly, wherein the assembly comprises a first beam structure comprising a first spatial frequency and a second beam structure comprising a second spatial frequency, wherein a first element of the first beam structure shifts the first spatial frequency of the assembly by approximately 180 degrees and a second element of the second beam structure shifts the second spatial frequency of the assembly by approximately 180 degrees such that a first optical resonance is generated, which is probed by the first optical signal interacting with the assembly, and a second optical resonance is generated, which is probed by the second optical signal interacting with the assembly, and wherein the first optical resonance and the second optical resonance are spectrally separated by a minimum threshold;
generating, by the circuitry, a filtered optical signal corresponding to a response by the assembly to the first optical signal without the second optical signal; and
generating, by the circuitry, an electrical signal based on the filtered optical signal, wherein the EOM is configured to modulate the second optical signal based on the electrical signal.

19. An optomechanical device for producing and detecting optical signals, the optomechanical device comprising:
an assembly comprising a first beam structure and a second beam structure, the first beam structure comprising a first plurality of indentations that are each spaced apart from an adjacent indentation of the first plurality of indentations by a first spacing and the second beam structure comprising a second plurality of indentations that are each spaced apart from an adjacent indentation of the second plurality of indentations by a second spacing;
one or more laser devices configured to generate a first optical signal and a second optical signal, wherein the first optical signal comprises a frequency different than a frequency of the second optical signal; and
circuitry configured to:
modulate, with an electro-optic modulator (EOM), the second optical signal;
output the first optical signal and the second optical signal to the assembly, wherein a first perturbed indentation of the first beam structure shifts a first spatial frequency of the first beam structure and a second perturbed indentation of the second beam structure shifts a second spatial frequency of the second beam structure such that a first optical resonance is generated, which is probed by the first optical signal interacting with the assembly, and a second optical resonance is generated, which is probed by the second optical signal interacting with the assembly, and wherein the first optical resonance and the second optical resonance are spectrally separated by a minimum threshold;
generate a filtered optical signal corresponding to a response by the assembly to the first optical signal without the second optical signal; and
generate an electrical signal based on the filtered optical signal, wherein the EOM modulates the second optical signal based on the electrical signal.

20. The optomechanical device of claim 19,
wherein each one of the first plurality of indentations is larger than the first perturbed indentation and wherein each one of the second plurality of indentations is larger than the second perturbed indentation; and/or
wherein the first perturbed indentation is positioned to an adjacent one of the first plurality of indentations at a distance that is less than the first spacing and wherein the second perturbed indentation is positioned to an adjacent one of the second plurality of indentations at a distance that is less than the second spacing.

\* \* \* \* \*